United States Patent
Yuan et al.

(10) Patent No.: US 11,295,827 B2
(45) Date of Patent: Apr. 5, 2022

(54) SHIFT REGISTER AND METHOD FOR DRIVING THE SAME, GATE DRIVING CIRCUIT AND DISPLAY APPARATUS

(71) Applicants: HEFEI XINSHENG OPTOELECTRONICS TECHNOLOGY CO., LTD., Hefei (CN); BOE TECHNOLOGY GROUP CO., LTD., Beijing (CN)

(72) Inventors: Zhidong Yuan, Beijing (CN); Yongqian Li, Beijing (CN); Can Yuan, Beijing (CN)

(73) Assignees: HEFEI XINSHENG OPTOELECTRONICS TECHNOLOGY CO., LTD., Anhui (CN); BOE TECHNOLOGY GROUP CO., LTD., Beijing (CN)

( * ) Notice: Subject to any disclaimer, the term of this patent is extended or adjusted under 35 U.S.C. 154(b) by 134 days.

(21) Appl. No.: 16/766,634

(22) PCT Filed: Oct. 25, 2019

(86) PCT No.: PCT/CN2019/113404
§ 371 (c)(1),
(2) Date: May 22, 2020

(87) PCT Pub. No.: WO2020/093886
PCT Pub. Date: May 14, 2020

(65) Prior Publication Data
US 2020/0372965 A1   Nov. 26, 2020

(30) Foreign Application Priority Data

Nov. 9, 2018   (CN) .......................... 201811336183.9

(51) Int. Cl.
*G11C 19/00* (2006.01)
*G11C 19/28* (2006.01)
(Continued)

(52) U.S. Cl.
CPC ........... *G11C 19/28* (2013.01); *G09G 3/3266* (2013.01); *G11C 7/1051* (2013.01); *G11C 7/12* (2013.01); *G11C 19/188* (2013.01)

(58) Field of Classification Search
None
See application file for complete search history.

(56) References Cited

U.S. PATENT DOCUMENTS

| 10,825,539 B2 | 11/2020 | Feng et al. |
| 2020/0168162 A1* | 5/2020 | Feng ................ G11C 19/28 |

(Continued)

FOREIGN PATENT DOCUMENTS

| CN | 108648716 A | 10/2018 |
| CN | 108682397 A | 10/2018 |

(Continued)

OTHER PUBLICATIONS

International Search Report and Written Opinion dated Feb. 1, 2020, for corresponding PCT Application No. PCT/CN2019/113404.

*Primary Examiner* — Tuan T Lam
(74) *Attorney, Agent, or Firm* — Kinney & Lange, P.A.

(57) ABSTRACT

The embodiments of the present disclosure propose a shift register and a method for driving the same, a gate driving circuit, and a display apparatus. The shift register includes: a scanning circuit configured to generate a first signal for causing a gate driving signal output by the shift register to have a row shift portion during a scanning period; a sensing circuit configured to generate a second signal for causing the gate driving signal to have a frame shift portion during a blanking period; and a random shift circuit electrically (Continued)

coupled to the scanning circuit and the sensing circuit respectively, and configured to generate the gate driving signal having the row shift portion and randomly having the frame shift portion based on the first signal and the second signal.

20 Claims, 5 Drawing Sheets

(51) Int. Cl.
  *G09G 3/3266* (2016.01)
  *G11C 7/10* (2006.01)
  *G11C 7/12* (2006.01)
  *G11C 19/18* (2006.01)

(56) References Cited

U.S. PATENT DOCUMENTS

2020/0286420 A1* 9/2020 Bai .................. G09G 3/2092
2021/0335197 A1* 10/2021 Feng .................. G11C 19/28
2021/0335266 A1* 10/2021 Feng .................. G09G 3/3266

FOREIGN PATENT DOCUMENTS

| CN | 109920465 A | 6/2019 |
| KR | 20170078978 A | 7/2017 |

* cited by examiner

US 11,295,827 B2

SHIFT REGISTER AND METHOD FOR DRIVING THE SAME, GATE DRIVING CIRCUIT AND DISPLAY APPARATUS

CROSS-REFERENCE TO RELATED APPLICATION(S)

This application is the national phase of PCT Application No. PCT/CN2019/113404 filed on Oct. 25, 2019, which in turn claims priority to the Chinese Patent Application No. CN 201811336183.9, filed on Nov. 9, 2018, which is incorporated herein by reference in its entirety.

TECHNICAL FIELD

The present disclosure relates to the field of display technology, and more particularly, to a shift register and a method for driving the same, a gate driving circuit, and a display apparatus.

BACKGROUND

With the advancement of technology, Organic Light Emitting Diode (OLED) display technology has been widely used. For example, Active Matrix Organic Light Emitting Diode (AMOLED) displays are expected to replace liquid crystal to become a mainstream choice for next-generation displays due to high contrast, wide viewing angles, and fast response speeds. In pixel circuit design of conventional OLED products, in consideration of process limitations, pixel circuits are generally all designed using N-type Thin Film Transistors (TFTs). In order to keep light emission of displays uniform, driving voltages in the pixel circuits need to be compensated.

SUMMARY

According to some embodiments of the present disclosure, there are provided a shift register and a method for driving the same, a gate driving circuit, and a display apparatus.

According to an aspect, the embodiments of the present disclosure provide a shift register. The shift register comprises:

a scanning circuit configured to generate a first signal for causing a gate driving signal output by the shift register to have a row shift portion during a scanning period;

a sensing circuit configured to generate a second signal for causing the gate driving signal to have a frame shift portion during a blanking period; and a random shift circuit electrically coupled to the scanning circuit and the sensing circuit respectively, and configured to generate the gate driving signal having the row shift portion and randomly having the frame shift portion based on the first signal and the second signal.

In an example, the first signal comprises at least one of a signal at a pull-up node of the scanning circuit, a signal at a pull-down node of the scanning circuit, or a signal at an output terminal of the scanning circuit; and the second signal comprises at least one of a signal at a pull-up node of the sensing circuit, a signal at a pull-down node of the sensing circuit, or a signal at an output terminal of the sensing circuit.

In some embodiments, the sensing circuit is coupled to a random clock signal terminal, and is configured to cause the signal at the pull-up node of the sensing circuit to remain valid during the scanning period and the blanking period in response to occurrence of a random change in a signal waveform at the random clock signal terminal during the scanning period; and the random shift circuit is coupled to the pull-up node or the output terminal of the sensing circuit, is also coupled to the pull-up node of the scanning circuit, and a frame shift clock signal terminal, and is configured to cause a voltage at the frame shift clock signal terminal to be stored at the pull-up node of the scanning circuit under control of the signal at the pull-up node or the output terminal of the sensing circuit during the blanking period, and generate the gate driving signal having the frame shift portion based on the stored voltage In some embodiments, the random shift circuit comprises:

a cascaded output control sub-circuit coupled to an output enabling terminal, a first control output terminal, a second control output terminal, the output terminal of the sensing circuit and the output terminal of the scanning circuit, and configured to provide the signal at the output terminal of the sensing circuit to the first control output terminal and provide the signal at the output terminal of the scanning circuit to the second control output terminal under control of the output enabling terminal;

a frame shift sub-circuit coupled to the output enabling terminal, the pull-up node and the pull-down node of the sensing circuit, a frame shift clock signal terminal, a random clock signal terminal, a first reference signal terminal, and the pull-up node of the scanning circuit, and configured to transmit a frame shift clock signal at the frame shift clock signal terminal to the pull-up node of the scanning circuit under control of the output enabling terminal, the pull-up node of the sensing circuit, the pull-down node of the sensing circuit, the random clock signal terminal, and the first reference signal terminal; and an output sub-circuit coupled to an output clock signal terminal, the pull-up node and the pull-down node of the scanning circuit, a second reference signal terminal and an output terminal of the shift register, and configured to selectively transmit one of an output clock signal at the output clock signal terminal and a second reference signal at the second reference signal terminal to the output terminal of the shift register as the gate driving signal output by the shift register under control of the pull-up node of the scanning circuit and the pull-down node of the scanning circuit.

In some embodiments, the random clock signal terminal is configured to randomly remain at a continuous potential under control of a random signal.

In some embodiments, the random shift circuit comprises:

a cascaded output control sub-circuit coupled to a signal switching terminal, a first control output terminal, a second control output terminal, the output terminal of the sensing circuit and the output terminal of the scanning circuit, and configured to provide the signal at the output terminal of the sensing circuit to the first control output terminal and provide the signal at the output terminal of the scanning circuit to the second control output terminal under control of the signal switching terminal;

a frame shift sub-circuit coupled to an output enabling terminal, the pull-up node and the pull-down node of the sensing circuit, a frame shift clock signal terminal, a random clock signal terminal, a first reference signal terminal, and the pull-up node of the scanning circuit, and configured to transmit a frame shift clock signal at the frame shift clock signal terminal to the pull-up node of the scanning circuit under control of the output enabling terminal, the pull-up node of the sensing circuit, the pull-down node of the sensing circuit, the random clock signal terminal, and the first reference signal terminal; and an output sub-circuit coupled to an output clock signal terminal, the pull-up node and the pull-down node of the scanning circuit, a second reference signal terminal and an output terminal of the shift register, and configured to selectively transmit one of an output clock signal at the output clock signal terminal and a second reference signal at the second reference signal terminal to the output terminal of the shift register as the gate driving signal output by the shift register under control of the pull-up node of the scanning circuit and the pull-down node of the scanning circuit.

In some embodiments, the cascaded output control sub-circuit comprises a first transistor and a second transistor, wherein the first transistor has a control terminal coupled to the signal switching terminal, a first terminal coupled to the output terminal of the sensing circuit, and a second terminal coupled to the first control output terminal; and the second transistor has a control terminal coupled to the signal switching terminal, a first terminal coupled to the output terminal of the scanning circuit, and a second terminal coupled to the second control output terminal.

In some embodiments, the random shift circuit comprises a cascaded output control sub-circuit, a frame shift sub-circuit and an output sub-circuit, and the frame shift sub-circuit comprises a third transistor, a fourth transistor, a fifth transistor, and a sixth transistor, wherein the third transistor has a control terminal coupled to the pull-up node of the sensing circuit, a first terminal coupled to a random clock signal terminal, and a second terminal coupled to a control terminal of the fourth transistor;

the fourth transistor has a control terminal coupled to a pull-down node of the sensing circuit, a first terminal coupled to the first reference signal terminal, and a second terminal coupled to the control terminal of the fifth transistor;

the fifth transistor has a first terminal coupled to a frame shift clock signal terminal, and a second terminal coupled to a first terminal of the sixth transistor; and the sixth transistor has a control terminal coupled to an output enabling terminal, and a second terminal coupled to the pull-up node of the scanning circuit.

In some embodiments, the random shift circuit comprises:

a cascaded output control sub-circuit coupled to an output enabling terminal, a first control output terminal, a second control output terminal, the output terminal of the sensing circuit and the output terminal of the scanning circuit, and configured to provide the signal at the output terminal of the sensing circuit to the first control output terminal and provide the signal at the output terminal of the scanning circuit to the second control output terminal under control of the output enabling terminal;

a frame shift sub-circuit coupled to the output enabling terminal, the output terminal of the sensing circuit, a frame shift clock signal terminal, and the pull-up node of the scanning circuit, and configured to transmit a frame shift clock signal at the frame shift clock signal terminal to the pull-up node of the scanning circuit under control of the output enabling terminal, and the output terminal of the sensing circuit; and an output sub-circuit coupled to an output clock signal terminal, the pull-up node and the pull-down node of the scanning circuit, a second reference signal terminal and an output terminal of the shift register, and configured to selectively transmit one of an output clock signal at the output clock signal terminal and a second reference signal at the second reference signal terminal to the output terminal of the shift register as the gate driving signal output by the shift register under control of the pull-up node and the pull-down node of the scanning circuit.

In some embodiments, the scanning circuit and the sensing circuit are further configured to selectively receive input signals under control of the signal switching terminal, the output terminal of the sensing circuit is used as a first control output terminal, and the output terminal of the scanning circuit is used as a second control output terminal.

In some embodiments, the random shift circuit comprises:

a frame shift sub-circuit coupled to an output enabling terminal, the output terminal of the sensing circuit, a frame shift clock signal terminal and the pull-up node of the scanning circuit, and configured to transmit a frame shift clock signal at the frame shift clock signal terminal to the pull-up node of the scanning circuit under control of the output enabling terminal and the output terminal of the sensing circuit; and an output sub-circuit coupled to an output clock signal terminal, the pull-up node and the pull-down node of the scanning circuit, a second reference signal terminal and an output terminal of the shift register, and configured to selectively transmit one of an output clock signal at the output clock signal terminal and a second reference signal at the second reference signal terminal to the output terminal of the shift register as an output signal of the shift register under control of the pull-up node and the pull-down node.

In some embodiments, the frame shift sub-circuit comprises a fifth transistor and a sixth transistor, wherein the fifth transistor has a control terminal coupled to the output terminal of the sensing circuit, a first terminal coupled to the frame shift clock signal terminal, and a second terminal coupled to a first terminal of the sixth transistor; and the sixth transistor has a control terminal coupled to the output enabling terminal, and a second terminal coupled to the pull-up node of the scanning circuit.

In some embodiments, the random shift circuit comprises a cascaded output control sub-circuit, a frame shift sub-circuit and an output sub-circuit, and the cascaded output control sub-circuit comprises an inverter, a first transistor, and a second transistor, wherein the inverter has a first terminal coupled to the output enabling terminal, and a second terminal coupled to a control terminal of the first transistor and a control terminal of the second transistor;

the first transistor has a first terminal coupled to an output terminal of the sensing circuit, and a second terminal coupled to a first control output terminal; and the second transistor has a first terminal coupled to the output terminal of the scanning circuit, and a second terminal coupled to a second control output terminal.

In some embodiments, the random shift circuit comprises a cascaded output control sub-circuit, a frame shift sub-circuit and an output sub-circuit, and the output sub-circuit comprises a seventh transistor and an eighth transistor, wherein the seventh transistor has a control terminal coupled to the pull-up node of the scanning circuit, a first terminal coupled to the output clock signal terminal, and a second terminal coupled to the output terminal of the shift register; and the eight transistor has a control terminal coupled to the pull-down node of the scanning circuit, a first terminal coupled to the second reference signal terminal, and a second terminal coupled to the output terminal of the shift register.

According to another aspect, there is provided a gate driving circuit, comprising a plurality of cascaded shift registers described above.

According to another aspect, there is provided a display apparatus, comprising the gate driving circuit described above.

According to another aspect, there is provided a method for driving the shift register described above, comprising:

generating, by the scanning circuit, a first signal for causing a gate driving signal to have a row shift portion during a scanning period under control of an output clock signal at an output clock signal terminal;

generating, by the sensing circuit, a second signal for causing the gate driving signal to have a frame shift portion during a blanking period under control of a random clock signal at a random clock signal terminal; and generating, by the random shift circuit, the gate driving signal having the row shift portion and randomly having the frame shift portion based on the first signal and the second signal under control of a frame shift clock signal at a frame shift clock signal terminal, the output clock signal at the output clock signal terminal, and an output enabling signal at an output enabling terminal.

In some embodiments, the shift register further comprises a signal switching terminal coupled to the random shift circuit or to the scanning circuit and the sensing circuit, and when a signal at the signal switching terminal and the signal at the output enabling terminal are inverted from each other, the random shift circuit generates the gate driving signal having the row shift portion and randomly having the frame shift portion according to the first signal and the second signal.

In some embodiments, the shift register further comprises a signal switching terminal coupled to the random shift circuit or to the scanning circuit and the sensing circuit, and when a signal at the signal switching terminal is a constant high level signal, the random shift circuit generates the gate driving signal having the row shift portion and sequentially having the frame shift portion according to the first signal and the second signal.

In some embodiments, the frame shift sub-circuit comprises a fifth transistor and a sixth transistor, wherein the fifth transistor has a control terminal coupled to the output terminal of the sensing circuit, a first terminal coupled to the frame shift clock signal terminal and a second terminal coupled to a first terminal of the sixth transistor; and the sixth transistor has a control terminal coupled to the output enabling terminal, and a second terminal coupled to the pull-up node of the scanning circuit.

BRIEF DESCRIPTION OF THE ACCOMPANYING DRAWINGS

The above and other purposes, features, and advantages of the present disclosure will be made clearer by describing the preferred embodiments of the present disclosure below with reference to the accompanying drawings, in which.

DETAILED DESCRIPTION

Figure 1:
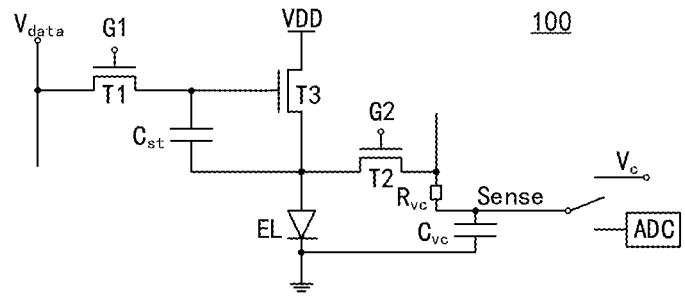
FIG. 1 is a circuit schematic diagram illustrating an exemplary pixel circuit according to an embodiment of the present disclosure.

A part of the embodiments of the present disclosure will be described in detail below with reference to the accompanying drawings, in which details and functions which are not necessary for the present disclosure are omitted in the description in order to prevent confusion in the understanding of the present disclosure. In the present specification, the following description of various embodiments for describing the principles of the present disclosure is illustrative only and should not be construed as limiting the scope of the disclosure in any way. The following description of the drawings, with reference to the accompanying drawings, is provided to assist in a comprehensive understanding of the example embodiments of the disclosure as defined by the claims and their equivalents. The following description includes many specific details to assist in the understanding, but such details are to be regarded as merely exemplary. Accordingly, those of ordinary skill in the art will recognize that numerous changes and modifications can be made to the embodiments described herein without departing from the scope and spirit of the present disclosure. In addition, descriptions of well-known functions and structures are omitted for clarity and conciseness. In addition, the same reference numerals are used for the same or similar functions, devices and/or operations throughout the accompanying drawings. Further, in the accompanying drawings, various parts are not necessarily drawn to scale. In other words, relative sizes, lengths etc. of the various parts in the accompanying drawings do not necessarily correspond to actual ratios.

In the present disclosure, terms "include" and "contain" and their derivatives are intended to be inclusive and not restrictive, and the term "or" is inclusive, meaning and/or. In addition, in the following description of the present disclosure, oriental terms which are used such as "up," "down," "left," "right," etc. are used to indicate relative positional relationships to assist those skilled in the art in understanding the embodiments of the present disclosure. Therefore, those skilled in the art should understand that "up"/"down" in one direction may be changed to "down"/"up" in an opposite direction and may be changed to another positional relationship in another direction, such as "left"/"right" etc.

In addition, in the context of the present disclosure, unless stated on the contrary, a term "control terminal" is generally used to refer to a gate or a base of a transistor, etc.; a "first terminal" and a "second terminal" of the transistor may refer to a source and a drain of the transistor or the drain and the source of the transistor respectively, or may refer to a collector and an emitter of the transistor or the emitter and the collector of the transistor; and a "first terminal" and a "second terminal" of a capacitor may refer to two electrodes thereof respectively.

As described above, in order to realize compensation for a driving voltage in a pixel circuit, a design of a 3T2C pixel circuit as shown in FIG. 1 may usually be adopted, that is, three transistors M1, M2, and M3 and two capacitors $C_{st}$ and $C_{VC}$, wherein the transistor M1 is used to conduct a data signal from a data line $V_{data}$ to a gate of the third transistor M3 under the driving of a first gate driving signal (or a scanning signal) G1, and thereby a driving voltage VDD may be selectively transmitted to a light-emitting device (for example, an OLED light-emitting device) EL according to the data signal so that the light-emitting device EL emits light. In addition, the transistor M2 is selectively turned on or turned off under the driving of a second gate driving signal (or a sensing signal) G2, so that the voltage applied to the light-emitting device may be sensed and provided to an Analog-to-Digital Converter (ADC) for processing and calculation, and thereby the respective data signal/first gate driving signal is adjusted, to enable the light emission to be more uniform.

Figure 2:
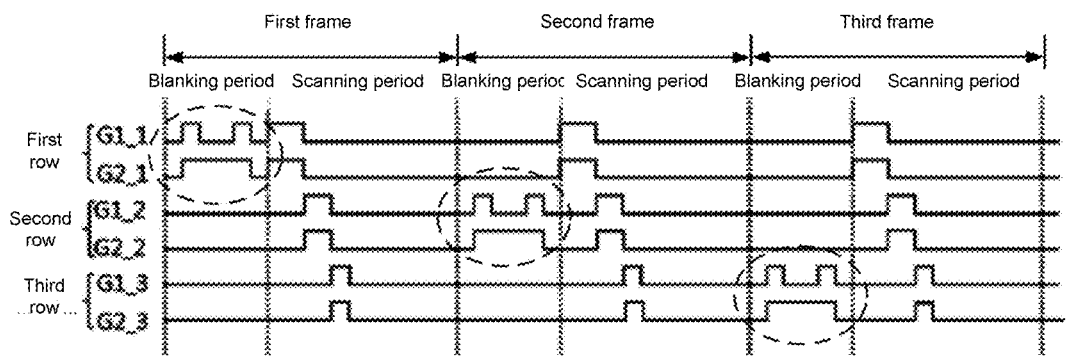
FIG. 2 is a timing diagram illustrating an operation of a gate driving signal of an exemplary pixel circuit according to an embodiment of the present disclosure.

FIG. 2 illustrates an exemplary timing diagram of the first gate driving signal G1 and the second gate driving signal G2. It should be illustrated that although FIG. 2 only illustrates an operating timing of the first gate driving signal G1 and second gate driving signal G2 for three rows during three frames, those skilled in the art may determine an operating timing of the first gate driving signal G1 and the second gate driving signal G2 for any row during any frame. As shown in FIG. 2, a period of each frame comprises a blanking period and a scanning period. Each of the gate driving signals has a row shift portion during the scanning period and has a frame shift portion during the blanking period. The row shift portion refers to a portion of the gate driving signal generated by the register which is shifted row by row. For example, as shown in FIG. 2, in each of a "first frame", a "second frame", and a "third frame", a portion of a gate driving signal for a row is sequentially shifted with respect to a portion of a driving signal for an adjacent row in the same frame, thereby realizing progressive scanning of pixels in the same frame. The frame shift portion refers to a portion of the gate driving signal generated by the register which is shifted frame by frame. For example, as shown by dotted boxes in FIG. 2, a portion of a gate driving signal for a row in a frame appears to be shifted sequentially with respect to a portion of a gate driving signal for an adjacent row in an adjacent frame, thereby realizing sensing of a row of pixels every frame.

In a common external compensation method, as shown in FIG. 2, during the blanking period of each frame, the gate driving circuit generates a gate driving signal having a sequential frame shift timing. However, this method easily causes OLED display apparatuses to produce compensation horizontal stripes and affect the display picture quality. Therefore, in order to achieve a "random frame shift" capable of eliminating the compensation stripes, it is necessary to provide a scheme capable of outputting a gate driving signal having the "random frame shift".

Hereinafter, a shift register capable of providing a gate driving signal having a random frame shift and a method for driving the same, a gate driving circuit, and a display apparatus according to the embodiments of the present disclosure will be described in detail with reference to FIGS. 3 to 10. Hereinafter, the embodiments of the present disclosure will be described in detail by taking the second gate driving signal G2 for controlling the transistor M2 as an example. However, it should be illustrated that principles of the following embodiments of the present disclosure may also be applied to other occasions where a shift register is required. For example, the following embodiments may be simply modified, and then may be applied to the first gate driving signal G1 for controlling the transistor M1 shown in FIG. 1. In addition, unless otherwise stated herein, the thin film transistors TFTs used are all N-type transistors. However, the present disclosure is not limited thereto. In fact, only a simple change is needed to be made to each input level, connection relationship, etc. of the embodiments of the present disclosure to enable the present disclosure to be suitable for P-type transistors.

Figure 3:
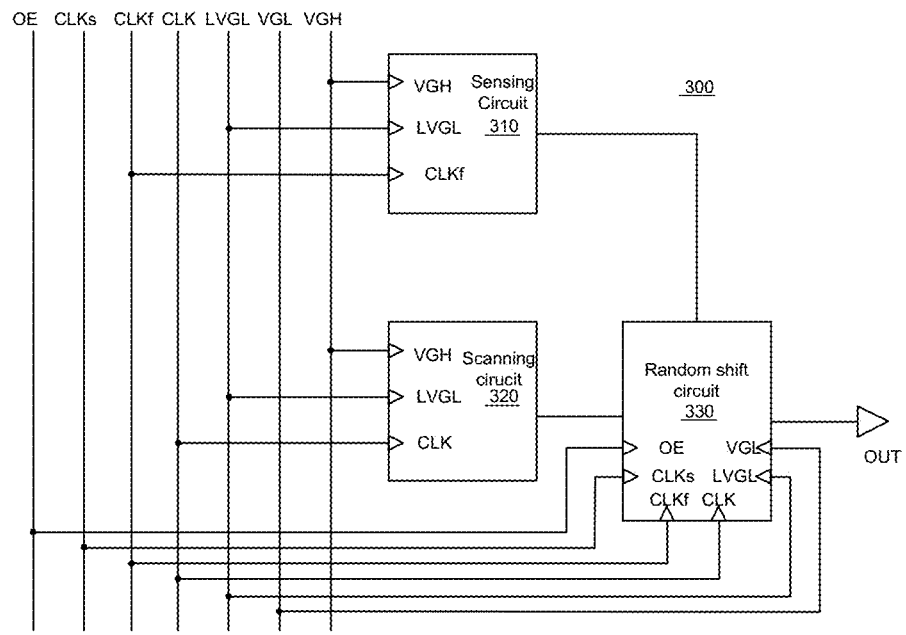
FIG. 3 is a diagram illustrating a configuration of an exemplary shift register according to an embodiment of the present disclosure.

FIG. 3 is a diagram illustrating a configuration of an exemplary shift register 300 according to an embodiment of the present disclosure. As shown in FIG. 3, the shift register 300 may comprise a sensing circuit 310, a scanning circuit 320, and a random shift circuit 330. In some embodiments, the scanning circuit 320 may be configured to generate a first signal for causing a gate driving signal to have a row shift portion during a scanning period. In some embodiments, the sensing circuit 310 may be configured to generate a second signal for causing the gate driving signal to have a frame shift portion during a blanking period. In addition, in some embodiments, the random shift circuit 330 may be electrically coupled to the scanning circuit 320 and the sensing circuit 310 respectively, and is configured to generate the gate driving signal having the row shift portion and randomly having the frame shift portion based on the first signal and the second signal. It should be illustrated that the "first signal" and the "second signal" used herein may refer to one or more signals, and are not limited to a single signal.

In FIG. 3, the sensing circuit 310 is coupled to a random clock signal terminal CLKf, a power supply signal terminal (for example, a third voltage signal terminal) VGH, and a first reference signal terminal (for example, a first voltage signal terminal) LVGL; the scanning circuit 320 is coupled to an output clock signal terminal CLK, the power supply signal terminal VGH, and the first reference signal terminal LVGL; and the random shift circuit 330 is coupled to an enabling terminal OE, a frame shift clock signal terminal CLKs, the random clock signal terminal CLKf, the power supply signal terminal VGH, the first reference signal terminal LVGL, a second reference signal terminal (for example, a second voltage signal terminal) VGL, and an output terminal OUT of the shift register 300.

Theoretically, the sensing circuit 310 and/or the scanning circuit 320 may be implemented using any conventional shift register design or a shift register design which will be developed in the future. For example, either or both of the sensing circuit 310 and the scanning circuit 320 may be a Gate In Panel (GIP) shift register unit(s), which may provide a standard signal shift function according to a clock signal. In addition, the sensing circuit 310 and/or the scanning circuit 320 may also be implemented using a specific exemplary configuration as described below in conjunction with FIG. 9 or FIG. 10, and the present disclosure is not limited thereto.

Figure 4:
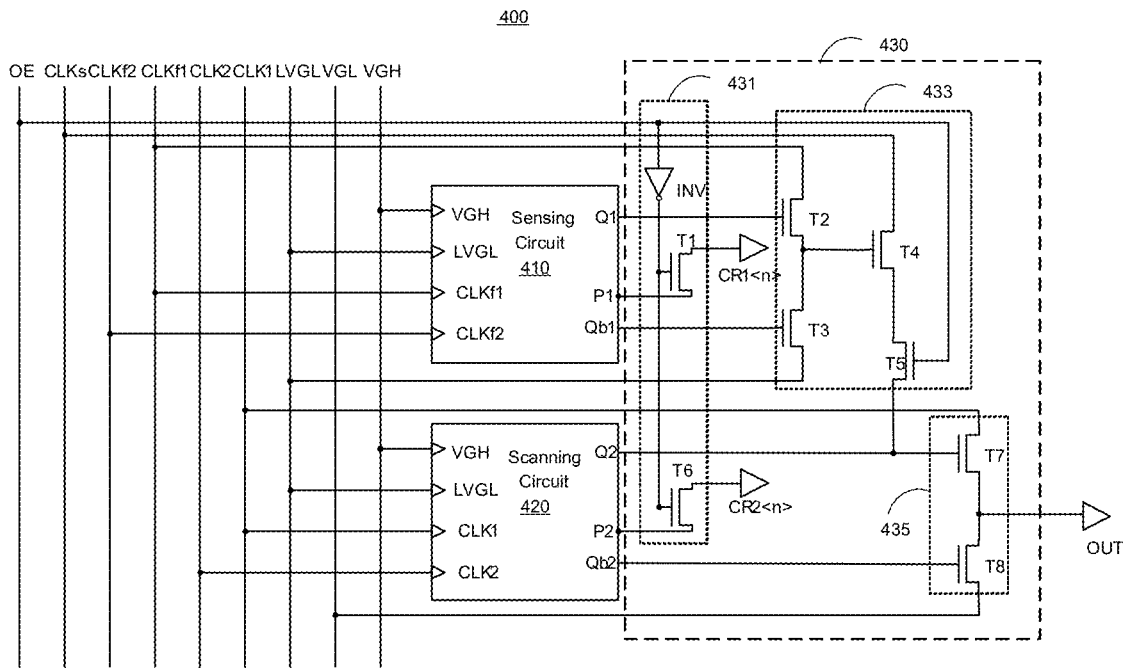
FIG. 4 is a circuit schematic diagram illustrating an exemplary shift register according to an embodiment of the present disclosure.
Figure 6:
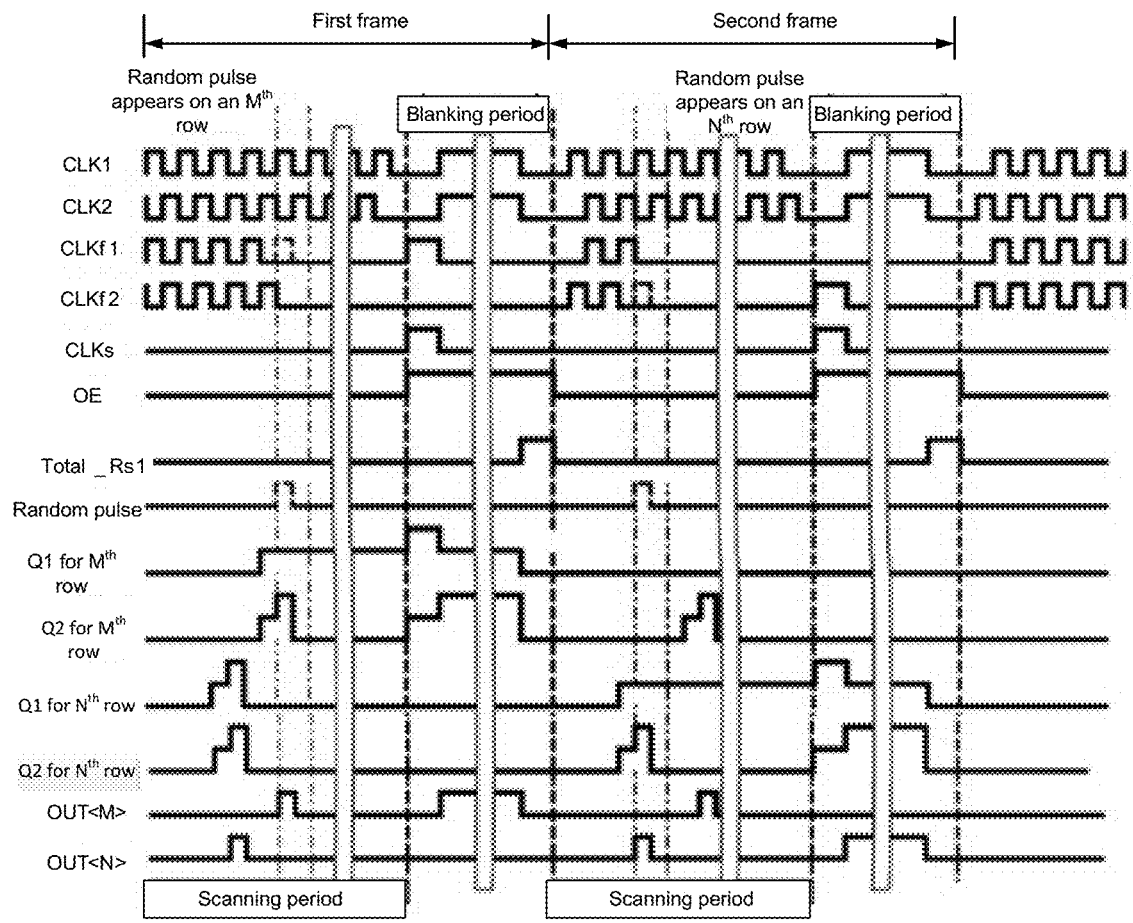
FIG. 6 is a timing diagram illustrating an exemplary operation of an exemplary shift register according to an embodiment of the present disclosure.

In addition, although an exemplary connection relationship between various circuits and various signal lines is shown in FIG. 3, the present disclosure is not limited thereto. In fact, other connection relationships may of course be used, for example, connection relationships in FIG. 4, FIG. 7, FIG. 8, FIG. 9, and FIG. 10 or other connection relationships. In addition, the following examples in FIGS. 4, 6, and 8 show that two output clock signal terminals CLK1 and CLK2 receive a first output clock signal and a second output clock signal respectively, wherein the first output clock signal is an inverted signal of the second output clock signal. For each shift register, one of the first output clock signal and the second output clock signal may be selected to be used. For example, in a gate driving circuit comprising multiple stages of cascaded shift registers, output clock signal terminals of odd-numbered stages of shift registers may be coupled to receive the first output clock signal, and output clock signal terminals of even-numbered stages of shift registers may be coupled to receive the second output clock signal. Similarly, the following FIGS. 4, 6, and 8 illustrates that the two random clock signal terminals CLKf1 and CLKf2 receive a first random clock signal and a second random clock signal respectively, wherein the first random clock signal is an inverted signal of the second random clock signal. For each shift register, one of the first random clock signal and the second random clock signal may be selected to be used. For example, also in the gate driving circuit comprising the multiple stages of cascaded shift registers, random clock signal terminals of the odd-numbered stages of shift registers may be coupled to receive the first random clock signal, and random clock signal terminals of the even-numbered stages of shift registers may be coupled to receive the second random clock signal.

FIG. 4 is a circuit schematic diagram illustrating an exemplary shift register 400 according to an embodiment of the present disclosure. The shift register 400 shown in FIG. 4 may be a specific example of the shift register 300 shown in FIG. 3. As described above, the sensing circuit 410 and/or the scanning circuit 420 may be implemented using a conventional shift register design or a shift register design which will be developed in the future. Therefore, specific circuits of the sensing circuit 410 and the scanning circuit 420 are not shown in FIG. 4, but this does not affect those skilled in the art to realize desired functions by reasonably selecting proper circuit designs of the sensing circuit 410 and the scanning circuit 420 according to other portions.

As shown in FIG. 4, the sensing circuit 410 may be coupled to the random clock signal terminal CLKf. The sensing circuit 410 may cause a signal at a pull-up node Q1 of the sensing circuit 410 to remain valid during both the scanning period and the blanking period in response to occurrence of a random change in a signal waveform at the random clock signal terminal CLKf during the scanning period. The random shift circuit 430 may be coupled to the pull-up node Q1 of the sensing circuit 410, a pull-up node Q2 of the scanning circuit 420, and the frame shift clock signal terminal CLKs. The random shift circuit 430 may cause the scanning circuit 420 to store a voltage at the frame shift clock signal terminal CLKs at the pull-up node Q2 thereof under control of the signal at the pull-up node Q1 of the sensing circuit 410 during the blanking period, and generate the gate driving signal having the frame shift portion based on the stored voltage.

As shown in FIG. 4, the random shift circuit 430 may comprise a cascaded output control sub-circuit 431, a frame shift sub-circuit 433, and an output sub-circuit 435. In some embodiments, the cascaded output control sub-circuit 431 may be coupled to an output enabling terminal OE, an output terminal P1 of the sensing circuit 410, an output terminal P2 of the scanning circuit 420, a first control output terminal CR1<n>, and a second control output terminal CR2<n> (in the present embodiment, it is assumed that the shift register shown in FIG. 4 is an $n^{th}$ stage of shift register, wherein <n> represents a number of the stage where the shift register is located). The first control output terminal CR1<n> and the second control output terminal CR2<n> may be coupled to an input terminal or a reset terminal of another (for example, an adjacent stage of) shift register to form a cascaded structure.

The cascaded output control sub-circuit 431 may provide a signal at the output terminal P1 of the sensing circuit 410 to the first control output terminal CR1<n> (and thus to the adjacent shift register) and provide a signal at the output terminal P2 of the scanning circuit 420 to the second control output terminal CR2<n>, as the input signal or the reset signal of the other shift register under control of the output enabling terminal OE. In some embodiments, the frame shift sub-circuit 433 may be coupled to the output enabling terminal OE, the pull-up node Q1 and a pull-down node Qb1 of the sensing circuit 410, the frame shift clock signal terminal CLKs, and the random clock signal terminals (although the two clock signal terminals CLKf1 and CLKf2 which receive the first random clock signal and the second random clock signal respectively are shown in FIG. 4, this is only illustrative, one of the two clock signal terminals CLKf1 and CLKf2 may be selected to be used as required, and in the present embodiment, it is assumed that the first random clock signal terminal CLKf1 is used to receive the first random clock signal), the first voltage signal terminal (the first reference signal terminal) LVGL, and the pull-up node Q2 of the scanning circuit 420, and is configured to transmit the frame shift clock signal at the frame shift clock signal terminal CLKs to the pull-up node Q2 under control of the output enabling terminal OE, the pull-up node Q1, the pull-down node Qb1, the first random clock signal terminal CLKf1, and the first voltage signal terminal LVGL. In some embodiments, the output sub-circuit 435 may be coupled to the clock signal terminals (although the two clock signal terminals CLK1 and CLK2 which receive the first output clock signal and the second output clock signal respectively are shown in FIG. 4, this is only illustrative, one of the two clock signal terminals CLK1 and CLK2 may be selected to be used as required, and in the present embodiment, it is assumed that the first output clock signal terminal CLK1 is used to receive the first output clock signal), the pull-up node Q2 and the pull-down node Qb2 of the scanning circuit 420, the second voltage signal terminal VGL, and the output terminal of the shift register 400, and is configured to selectively transmit one of the first output clock signal at the first output clock signal terminal CLK1 and the second voltage signal at the second voltage signal terminal (the second reference signal terminal) VGL to the output terminal OUT of the shift register 400 as an output signal (i.e., a gate driving signal) of the shift register 400, under control of the pull-up node Q2 and the pull-down node Qb2.

In some embodiments, the cascaded output control sub-circuit 431 may comprise an inverter INV, a first transistor T1, and a second transistor T2. The inverter INV may have a first terminal coupled to the output enabling terminal OE, and a second terminal coupled to a control terminal of the first transistor T1 and a control terminal of the second transistor T2. In addition, the first transistor T1 may have a first terminal coupled to the output terminal P1 of the sensing circuit 410, and a second terminal coupled to the first control output terminal CR1<n>, so as to be coupled to an input terminal of a sensing circuit of a next stage of shift register and a reset terminal of a sensing circuit of a previous stage of shift register. In addition, the second transistor T2 may have a first terminal coupled to the output terminal P2 of the scanning circuit 420, and a second terminal coupled to the second control output terminal CR2<n>, so as to be coupled to an input terminal of a scanning circuit of the next stage of shift register and/or a reset terminal of a scanning circuit of the previous stage of shift register. In addition, in some embodiments, the inverter INV may be an inverter formed by transistors, and may be implemented to have a desired structure as required, which will not be described in detail here.

Further, in some embodiments, the frame shift sub-circuit 433 may comprise a third transistor T3, a fourth transistor T4, a fifth transistor T5, and a sixth transistor T6. The third transistor T3 may have a control terminal coupled to the pull-up node Q1 of the sensing circuit 410, a first terminal coupled to the first random clock signal terminal CLKf1, and a second terminal coupled to a control terminal of the fifth transistor T5. The fourth transistor T4 may have a control terminal coupled to the pull-down node Qb1 of the sensing circuit 410, a first terminal coupled to the first voltage signal terminal LVGL, and a second terminal coupled to the control terminal of the fifth transistor T5. The fifth transistor T5 may have a first terminal coupled to the frame shift clock signal terminal CLKs, and a second terminal coupled to a first terminal of the sixth transistor T6. In addition, the sixth transistor T6 may have a control terminal coupled to the output enabling terminal OE, and a second terminal coupled to the pull-up node Q2 of the scanning circuit 420.

Further, in some embodiments, the output sub-circuit 435 may comprise a seventh transistor T7 and an eighth transistor T8. The seventh transistor T7 may have a control terminal coupled to the pull-up node Q2 of the scanning circuit 420, a first terminal coupled to the first output clock signal terminal CLK1, and a second terminal coupled to the output terminal OUT of the shift register 400. In addition, the eighth transistor T8 may have a control terminal coupled to the pull-down node Qb2 of the scanning circuit 420, a first terminal coupled to the second voltage signal terminal VGL, and a second terminal coupled to the output terminal OUT of the shift register 400.

In the embodiment shown in FIG. 4, CR1<n> represents a cascaded output terminal (a first control output terminal) of a sensing circuit 410 of an $n^{th}$ stage of shift register 400, which may be coupled to an input terminal of a sensing circuit of an $(n+1)^{th}$ stage of shift register and/or a reset terminal of a sensing circuit of an $(n-1)^{th}$ stage of shift register. Similarly, CR2<n> represents a cascaded output terminal (a second control output terminal) of a scanning circuit 420 of the $n^{th}$ stage of shift register 400, which may be coupled to an input terminal of a scanning circuit of the $(n+1)^{th}$ stage of shift register and/or a reset terminal of a scanning circuit of the $(n-1)^{th}$ stage of shift register.

In addition, as described in conjunction with FIG. 3, the second signal generated by the sensing circuit 410 may comprise, for example, the output signal output at the output terminal P1 thereof, the level signals at the pull-up node Q1 and the pull-down node Qb1 thereof etc. Similarly, the first signal generated by the scanning circuit 420 may comprise, for example, the output signal output at the output terminal P2 thereof, the level signals at the pull-up node Q2 and the pull-down node Qb2 thereof etc.

In addition, in some embodiments, the first voltage signal terminal LVGL and the second voltage signal terminal VGL may provide low voltage signals, which may have different voltages, for example, one of the low voltage signals has a voltage of −5V and the other of the low voltage signals has a voltage of 0V; and the third voltage signal terminal VGH may provide a high voltage signal, for example, a voltage signal of +5V; however, the present disclosure is not limited thereto, and the voltage signals provided at the voltage signal terminals depend entirely on a specific circuit design. For example, in some other embodiments, the first voltage signal terminal LVGL and the second voltage signal terminal VGL may provide low voltage signals having the same voltage.

Figure 5:
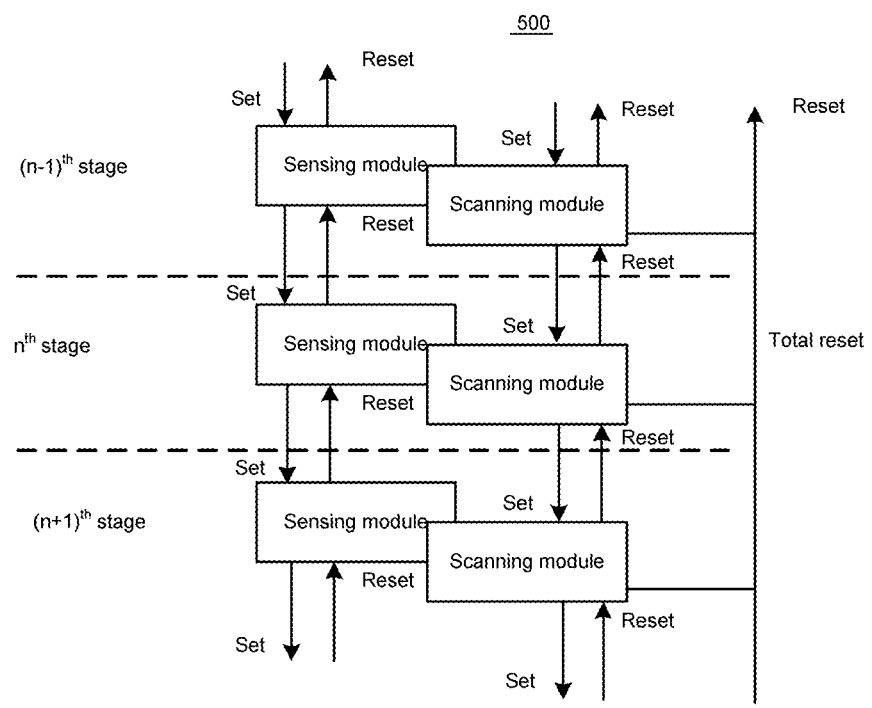
FIG. 5 is a connection relationship diagram illustrating an exemplary gate driving circuit according to an embodiment of the present disclosure.

FIG. 5 is a connection relationship diagram illustrating an exemplary gate driving circuit 500 according to an embodiment of the present disclosure. As shown in FIG. 5, the gate driving circuit 500 may be formed by cascading a plurality of shift registers (for example, the shift register 300 or 400) to be cascaded, wherein an output terminal of a sensing circuit or a scanning circuit of a previous stage of shift register may be an input (or set) terminal of a sensing circuit or a scanning circuit of a current stage of shift register, and an output terminal of a sensing circuit or a scanning circuit of a next stage of shift register may be a reset terminal of the sensing circuit or the scanning circuit of the current stage of shift register. For example, a first control output terminal CR1<n−1> of an $(n-1)^{th}$ stage of shift register is coupled to an input terminal of a sensing circuit of an $n^{th}$ stage of shift register, and a second control output terminal CR2<n−1> of the $(n-1)^{th}$ stage of shift register is coupled to an input terminal of a scanning circuit of the $n^{th}$ stage of shift register; and a first control output terminal CR1<n+1> of an $(n+1)^{th}$ stage of shift register is coupled to a reset terminal of the sensing circuit of the $n^{th}$ stage of shift register, and a second control output terminal CR1<n+2> of the $(n+1)^{th}$ stage of shift register is coupled to a reset terminal of the scanning circuit of the $n^{th}$ stage of shift register, so that the sensing circuits and the scanning circuits form respective cascaded structures.

In addition, clock signal terminals of adjacent stages of shift registers may receive clock signals which are inverted from each other in different orders. For example, if a first output clock signal terminal CLK1 and a second output clock signal terminal CLK2 of the $(n-1)^{th}$ stage of shift register are coupled to a first output clock signal line and a second output clock signal line respectively, a first output clock signal terminal CLK1 and a second output clock signal terminal CLK2 of the $n^{th}$ stage of shift register may be coupled to the second output clock signal line and the first output clock signal line respectively, and so on. Similarly, if a first random clock signal terminal CLKf1 and a second random clock signal terminal CLKf2 of the $(n-1)^{th}$ stage of shift register are coupled to a first random clock signal lines and a second random clock signal line respectively, a first random clock signal terminal CLKf1 and a second random clock signal terminal CLKf2 of the $n^{th}$ stage of shift register may be coupled to the second random clock signal line and the first random clock signal line respectively, and so on.

An operation timing of the shift register 400 shown in FIG. 6 will be described in detail with reference to FIGS. 4 and 5. FIG. 6 is a timing diagram illustrating an exemplary operation of the exemplary shift register 400 according to an embodiment of the present disclosure.

It is assumed that the first output clock signal terminal CLK1 and the second output clock signal terminal CLK2 of the shift register 400 are coupled to the first output clock signal line and the second output clock signal line respectively, and the first random clock signal terminal CLKf1 and the second random clock signal terminal CLKf2 of the shift register 400 are coupled to the first random clock signal line and the second random clock signal line respectively. Therefore, in the present embodiment, the respective clock signal terminals are represented by the same reference signs as those the respective clock signal lines without losing the generality.

As shown in FIG. 6, the first output clock signal line CLK1 and the second clock signal line CLK2 provide clock signals which are inverted from each other during a scanning period. In addition, the first random clock signal line CLKf1 and the second random clock signal line CLKf2 provide random clock signals during the scanning period. Each of the random clock signals may be a periodic pulse signal, and a waveform of the periodic pulse signal changes at a random time, for example, the waveform of the periodic pulse signal is continuously at a low level after the random time. For example, as shown in FIG. 6, after the random clock signals provided by the first random clock signal line CLKf1 and the second clock signal line CLK2 end after a number of pulse periods, a next pulse does not occur during a time period when the next pulse should have occurred, and instead, a continuous low level occurs during the time period. In some embodiments, the random clock signal terminals may remain at a continuous potential randomly under control of random signals. For example, a level of the periodic pulse signal may be forcibly and continuously pulled down by a random pulse signal to implement the random clock signal. In some embodiments, the random pulse signal may be generated by a Field Programmable Gate Array (FPGA).

According to the circuit design of the shift register 400 shown in FIG. 4, if an output signal is generated by a certain stage of shift register at the random time or during the time period, the stage of shift register may be controlled during a blanking period to output a gate driving signal required for sensing, which will be described in detail below. In other words, the clock signals on the first and second random clock signal lines CLKf1 and CLKf2 are equivalent to random clock signals for selecting respective rows of shift registers.

By taking FIG. 6 as an example, during a scanning period for a first frame, a high level pulse indicated by a dotted line in the first random clock signal on the first random clock signal line CLKf1 represents that a virtual "random pulse" occurs at that time, that is, a next pulse should have occurred at this time, but the next pulse does not occur, and instead, a continuous low level occurs. In order to illustrate this more clearly, FIG. 6 illustrates the virtual random pulse, which is not an actual signal, but represents that a high level which should have occurred at the time shown by the dotted line does not occur, and instead, a low level occurs. In FIG. 6, during a time period when the virtual "random pulse" occurs in the scanning period, an $M^{th}$ row of shift register generates an output signal OUT<M>, so that the $M^{th}$ row of shift register is selected and the selected $M^{th}$ row of shift register may generate a high level output signal during a blanking period to drive a respective row of pixel units to perform sensing, and other rows of shift registers unselected generate low level output signals.

Next, the principle of realizing a random frame shift will be described in detail with reference to both FIGS. 4 and 6. It is assumed that the shift register 400 shown in FIG. 4 is the $M^{th}$ row of shift register. Since the high level pulse at CLKf1 indicated by the dotted line is a random pulse which does not actually occur, it results in that the sensing circuit 410 of the shift register 400 shown in FIG. 4 outputs a low level during a time period corresponding to the random pulse. Thereby, inputs/outputs of sensing circuits of subsequent rows of shift registers starting from an $(M+1)^{th}$ row of shift register always remain at a low level, so that the sensing circuit 410 of the $M^{th}$ row of shift register 400 may not be reset by an output signal of a sensing circuit of an $(M+1)^{th}$ row of shift register, and thereby the first point Q1 of the $M^{th}$ row of shift register 400 always remains at a high level, as shown by "Q1 for $M^{th}$ row" in FIG. 6. Specifically, the sensing circuit 410 of the shift register 400 may output a high level only when a respective clock pulse thereof occurs during one frame. In other words, after first (M−1) cascaded sensing circuits sequentially output respective high levels thereof, the random clock signal terminal CLKf connected to the sensing circuit 410 of the current stage (i.e., the $M^{th}$ stage) of shift register should have been at a high level to cause the sensing circuit 410 to output a high level (for example, see the setting of the transistor T10 shown in FIG. 9, which is responsible for outputting the signal at the random clock signal terminal CLKf to the output terminal P1), but the high level does not occur at this time as described above, and it results in that the $M^{th}$ sensing circuit 410 no longer outputs a high level, and thereby there is no high level input to sensing circuits 410 of all subsequent stages of shift register units, and naturally, the sensing circuits 410 of all the subsequent stages of shift register units do not output high levels.

In addition, unlike the sensing circuit 410, the scanning circuit 420 is coupled to the first output clock signal line CLK1, and therefore during the time period when the random pulse occurs, a normal clock signal output is actually maintained. Thus, as shown by "Q2 for $M^{th}$ row" in FIG. 6, Q2 remains at a high potential during the respective time period, and is then reset by an output signal from a scanning circuit of the $(M+1)^{th}$ row of shift register to become a low potential.

Further, during the scanning period, the output enabling terminal OE always remains at a low level, and therefore after the signal at the output enabling terminal OE becomes a high level after passing through the inverter INV, the first transistor T1 and the second transistor T2 are turned on, so that the cascaded output terminals CR1<M> and CR2<M> of the sensing circuit 410 and the scanning circuit 420 remain to normally provide outputs. In addition, since the output enabling terminal OE always remains at a low level, the sixth transistor T6 always remains in a turn-off state under control of the output enabling terminal OE, and therefore the frame shift may not occur at the output terminal OUT of the shift register 400 during the scanning period. Therefore, as shown in FIG. 6, during the scanning period, the output terminal OUT<M> of the shift register unit outputs a normal gate scanning signal, that is, is at a high level during the respective time period, and is at a low level during remaining time periods.

Next, during the blanking period, the output enabling terminal OE remains at a high level, and therefore after the signal at the output enabling terminal OE becomes a low level after passing through the inverter IN, the first transistor T1 and the second transistor T2 are turned off, and then the first control output terminal CR1<M> and the second control output terminal CR2<M> of the sensing circuit 410 and the scanning circuit 420 may not output high levels, so that subsequent shift registers do not output high levels. In addition, since the output enabling terminal OE always remains at a high level, the sixth transistor T6 is turned on under control of the output enabling terminal OE, and then a path from the fifth transistor T5 to the pull-up node Q2 of the scanning circuit 420 is turned on.

As described above, the pull-up node Q1 of the sensing circuit 410 always remains at a high level during a later time period in the scanning period (i.e., after the random pulse occurs), and therefore the third transistor T3 is turned on, so that the signal at the first random clock signal line CLKf1 is transmitted to the gate of the fifth transistor T5. As shown in FIG. 6, the first random clock signal line CLKf1 outputs a high level signal at the beginning of the blanking period, so that the fifth transistor T5 is correspondingly turned on, and a high level signal at the frame shift clock signal terminal CLKs is transmitted to the pull-up node Q2 of the scanning circuit 420 through the fifth transistor T5 and the sixth transistor T6 which is turned on as described above.

Figure 9:
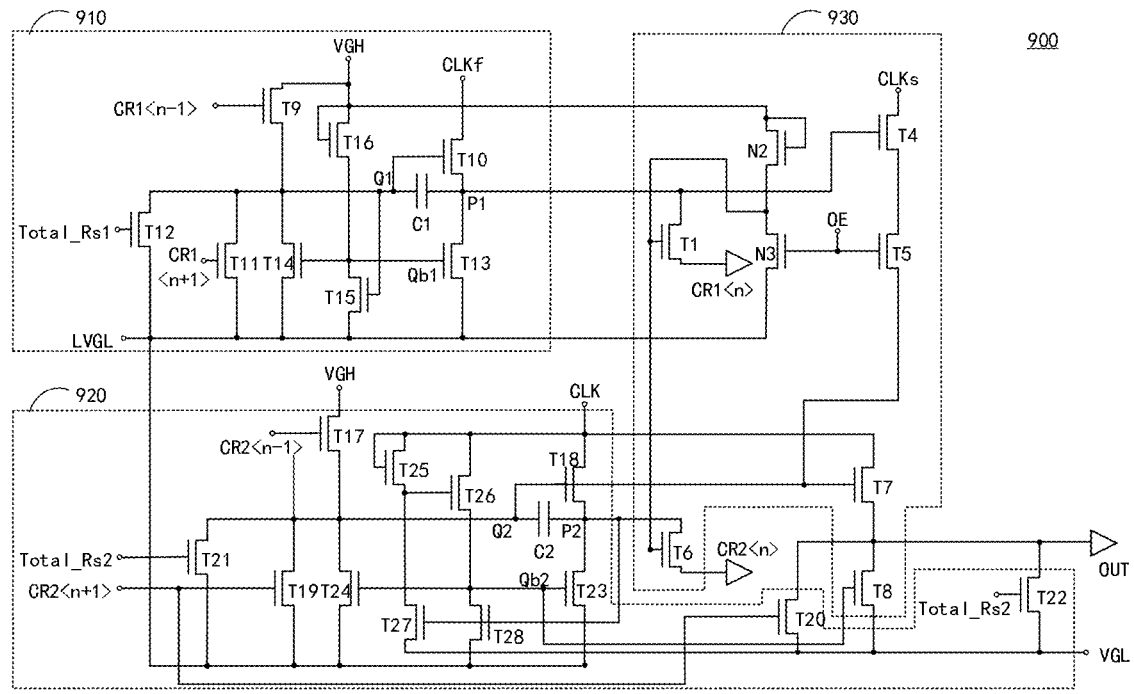
FIG. 9 is a circuit schematic diagram illustrating an exemplary shift register according to yet another embodiment of the present disclosure.

In the scanning circuit 420 shown in FIG. 4, similarly to the scanning circuit 920 shown in FIG. 9, a high level at the point Q2 may cause, for example, the eighteenth transistor T18 to be turned on, and cause the second capacitor C2 to start being charged. After the high level signal at the frame shift clock signal terminal CLKs ends, since the pull-up node Q2 remains at a high level at this time, and the first output clock signal at the first output clock signal terminal CLK1 changes from a low level to a high level, the potential at the pull-up node Q2 is raised to a higher level under the bootstrapping effect of the second capacitor C2, as shown by "Q2 for $M^{th}$ row" in FIG. 6. In addition, since there is no reset signal from a scanning circuit of a next stage of shift register, this high potential may be maintained until a total reset signal Total_Rs1 occurs. Therefore, the seventh transistor T7 is turned on under the action of the high potential at the pull-up node Q2, so that the output terminal OUT<M> outputs the first output clock signal at the first output clock signal terminal CLK1 as an output signal, so as to obtain the output signal shown by "OUT<M>" in FIG. 6. This output signal may be used as, for example, the second gate driving signal G2 of the pixel circuit shown in FIG. 1.

In the first frame, in an $N^{th}$ stage of shift register different from the $M^{th}$ stage of shift register, unlike the pull-up node Q1 of the sensing circuit 410 in the $M^{th}$ stage of shift register 400 which remains at a high level during the scanning period, a pull-up node Q1 of a sensing circuit of the $N^{th}$ stage of shift register does not remain at a high level during the scanning period, and therefore may always remain at a low level during a blanking period, as shown by "Q1 for $N^{th}$ row" in FIG. 6, which may cause a respective pull-up node Q2 to be at a low potential and cause an respective output terminal to be at a low level, as shown by "Q2 for $N^{th}$ row" and "OUT<N>" in FIG. 6.

Similarly, during a scanning period for a second frame, a high level pulse indicated by a dotted line on the second random clock signal line CLKf2 represents the arrival of a virtual random pulse (for more clarity, see a pulse in a "random pulse" row). During a time period when the virtual pulse occurs, the $N^{th}$ row of shift register generates a high level output signal at the output terminal OUT<N>. It is assumed here that the $M^{th}$ row of shift register is coupled to the first random clock signal terminal CLKf1 and the first output clock signal terminal CLK1, and the $N^{th}$ row of shift register is coupled to the second random clock signal terminal CLKf2 and the second output clock signal terminal CLK2, as shown in FIG. 5.

Similarly to the previous description of the $M^{th}$ row of shift register, the output terminal OUT<N> of the $N^{th}$ row of shift register outputs a second output clock signal at the second output clock signal terminal CLK2, to obtain an output signal in the second frame as shown by "OUT<N>" in FIG. 6. This output signal may be used as, for example, the second gate driving signal G2 of the pixel circuit shown in FIG. 1.

In the second frame, in the $M^{th}$ stage of shift register different from the $N^{th}$ stage of shift register, unlike the pull-up node Q1 of the sensing circuit in the $N^{th}$ row of shift register which remains at a high level during the scanning period, the pull-up node Q1 of the sensing circuit of the $M^{th}$ stage of shift register does not remain at a high level during the scanning period, and therefore may always remain at a low level during a blanking period, as shown by "Q1 for $M^{th}$ row" in FIG. 6, which may cause the respective pull-up node Q2 to be at a low potential and cause the respective output terminal to be at a low level, as shown by "Q2 for $M^{th}$ row" and "OUT<M>" in FIG. 6.

It may be seen that, as shown in FIG. 6, in two consecutive frames, frame shift is realized for a part of a gate driving signal output by in the $M^{th}$ stage of shift register with respect to a part of a gate driving signal output by the $N^{th}$ stage of shift register, thereby realizing the random frame shift function.

More generally, the driving method described in conjunction with FIG. 6 may comprise: generating, by the scanning circuit 420, a first signal for causing a gate driving signal to have a row shift portion during a scanning period under control of an output clock signal at an output clock signal terminal (for example, the first output clock signal at the first output clock signal terminal CLK1 or the second output clock signal at the second output clock signal terminal CLK2); generating, by the sensing circuit 410, a second signal for causing the gate driving signal to have a frame shift portion during a blanking period under control of a random clock signal at the random clock signal terminal (for example, the first random clock signal at the first random clock signal terminal CLKf1 or the second random clock signal at the second random clock signal terminal CLKf2); and generating, by the random shift circuit 430, the gate driving signal having the row shift portion and randomly having the frame shift portion based on the first signal and the second signal under control of a frame shift clock signal at the frame shift clock signal terminal CLKs, an output clock signal at the output clock signal terminal (for example, the first output clock signal at the first output clock signal terminal CLK1), a random clock signal at a random clock signal terminal (for example, the first random clock signal at the first random clock signal terminal CLKf1) and an output enabling signal at an output enabling terminal.

Figure 7:
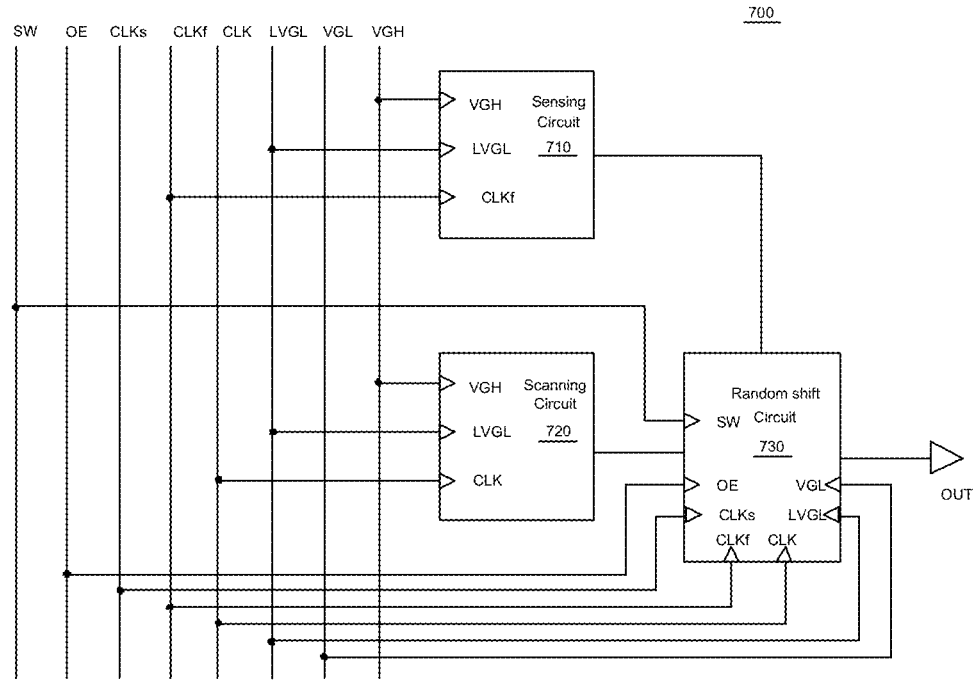
FIG. 7 is a diagram illustrating a configuration of an exemplary shift register according to another embodiment of the present disclosure.
Figure 8:
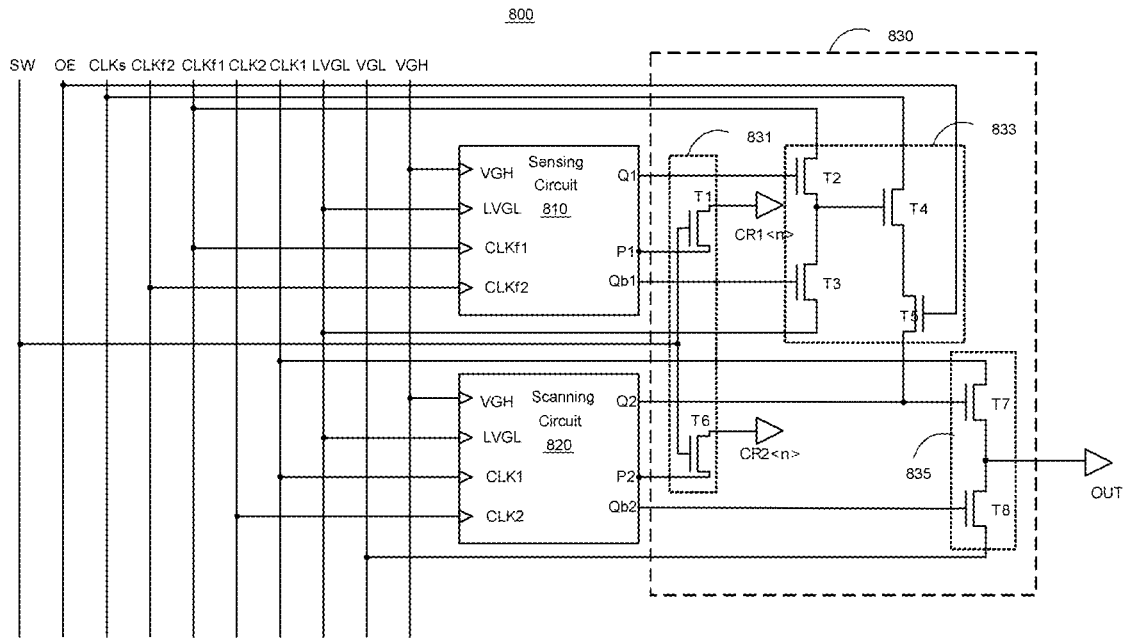
FIG. 8 is a circuit schematic diagram illustrating an exemplary shift register according to another embodiment of the present disclosure.

FIG. 7 is a diagram illustrating a configuration of an exemplary shift register 700 according to another embodiment of the present disclosure. As shown in FIG. 7, the shift register 700 may comprise a sensing circuit 710, a scanning circuit 720, and a random shift circuit 730. Similarly to FIG. 3, in some embodiments, the scanning circuit 720 may be configured to generate a first signal for causing a gate driving signal to have a row shift portion during a scanning period. Further, in some embodiments, the sensing circuit 710 may be configured to generate a second signal for causing the gate driving signal to have a frame shift portion during a blanking period. In some embodiments, the random shift circuit 730 may be electrically coupled to the scanning circuit 720 and the sensing circuit 710 respectively, and may be configured to be capable of generating the gate driving signal having the row shift portion and randomly having the frame shift portion based on the first signal and the second signal.

Similarly, the sensing circuit 710 and/or the scanning circuit 720 may be implemented using any conventional shift register design or a shift register design which will be developed in the future. For example, either or both of the sensing circuit 710 and the scanning circuit 720 may be GIP shift register units, which may provide a standard signal shift function based on a random clock signal. In addition, either or both of the sensing circuit 710 and the scanning circuit 720 may also be implemented using a specific exemplary configuration as described below in conjunction with FIG. 9 or FIG. 10, and the present disclosure is not limited thereto.

In addition, although an exemplary connection relationship between various circuits and various signal lines is shown in FIG. 7, the present disclosure is not limited thereto. In fact, other connection relationships may in fact be used, for example, connection relationships in FIG. 3, FIG. 4, FIG. 8, FIG. 9, and FIG. 10 etc. In addition, a first output clock signal at a first output clock signal terminal CLK1 and a second output clock signal at a second output clock signal terminal CLK2 are inverted from each other, a first random clock signal at a first random clock signal terminal CLKf1 and a second random clock signal at a second random clock signal terminal CLKf2 are inverted from each other, one of the first output clock signal terminal CLK1 and the second output clock signal terminal CLK2 may be selected to be used as required, and one of the first random clock signal terminal CLKf1 and the second random clock signal terminal CLKf2 may be selected to be used as required. For example, odd-numbered stages of shift registers in the gate driving circuit may be coupled to the first output clock signal terminal CLK1 and the first random clock signal terminal CLKf1, the second output clock signal terminal CLK2 and the second random signal terminal CLKf2 may be formed by inverters etc., and even-numbered stages of shift registers in the gate driving circuit are coupled to the second output clock signal terminal CLK2 and the second random clock signal terminal CLKf2, which are also true in other cases.

FIG. 8 is a circuit schematic diagram illustrating an exemplary shift register 800 according to another embodiment of the present disclosure. The shift register 800 shown in FIG. 8 may be a specific example of the shift register 700 shown in FIG. 7. As described above, the sensing circuit 810 and/or the scanning circuit 820 may be implemented using a conventional shift register design or a shift register design which will be developed in the future. Therefore, specific circuits of the sensing circuit 810 and the scanning circuit 820 are not shown in FIG. 8, but this does not affect those skilled in the art to realize desired functions by reasonably selecting proper circuit designs of the sensing circuit 810 and the scanning circuit 820 according to other portions.

As shown in FIG. 8, the random shift circuit 830 may comprise a cascaded output control sub-circuit 831, a frame shift sub-circuit 833, and an output sub-circuit 835. In some embodiments, the cascaded output control sub-circuit 831 may be coupled to a signal switching terminal SW, an output terminal P1 of the sensing circuit 810, an output terminal P2 of the scanning circuit 820, a first control output terminal CR1<n>, and a second control output terminal CR2<n>, so as to be coupled to an input terminal or a reset terminal of an adjacent shift register, and is configured to provide output signals at the output terminal of the sensing circuit 810 and the output terminal of the scanning circuit 820 to the first control output terminal CR1<n> and the second control output terminal CR2<n> respectively (and thus to the adjacent shift register) as the input signal or the reset signal of the adjacent shift register, under control of the signal switching terminal SW. In some embodiments, the frame shift sub-circuit 833 may be coupled to an output enabling terminal OE, a pull-up node Q1 and a pull-down node Qb1 of the sensing circuit 810, a frame shift clock signal terminal CLKs, a first random clock signal terminal ACLKf1, a first voltage signal terminal LVGL and a pull-up node Q2 of the scanning circuit 820, and is configured to transmit a frame shift clock signal at the frame shift clock signal terminal CLKs to the pull-up node Q2 under control of the output enabling terminal OE, the pull-up node Q1, the pull-down node Qb1, the first random clock signal terminal CLKf1, and the first voltage signal terminal LVGL. In some embodiments, the output sub-circuit 835 may be coupled to the first output clock signal terminal CLK1, the pull-up node Q2 and a pull-down node Qb2 of the scanning circuit 820, a second voltage signal terminal VGL and an output terminal OUT of the shift register 800, and is configured to selectively transmit one of a first output clock signal at the first output clock signal terminal CLK1 and a second voltage signal at the second voltage signal terminal VGL to the output terminal OUT of the shift register 800 as an output signal of the shift register 800, under control of the pull-up node Q2 and the pull-down node Qb2.

In some embodiments, the cascaded output control sub-circuit 831 may comprise a first transistor T1 and a second transistor T2. The first transistor T1 has a control terminal coupled to the signal switching terminal SW, a first terminal coupled to the output terminal P1 of the sensing circuit 810, and a second terminal coupled to the first control output terminal CR1<n>, so as to be coupled to an input terminal of a sensing circuit of a next stage of shift register and/or a reset terminal of a sensing circuit of a previous stage of shift register. In addition, the second transistor T2 may have a control terminal coupled to the signal switching terminal SW, a first terminal coupled to the output terminal P2 of the scanning circuit 820, and a second terminal coupled to the second control output terminal CR2<n>, so as to be coupled to an input terminal of a scanning circuit of the next stage of shift register and/or a reset terminal of a scanning circuit of the previous stage of shift register.

In addition, in some embodiments, the frame shift sub-circuit 833 and the output sub-circuit 835 may have structures which are the same as or similar to those of the frame shift sub-circuit 433 and the output sub-circuit 435 shown in FIG. 4.

The shift register 800 shown in FIG. 8 differs from the shift register 400 shown in FIG. 4 in that the cascaded output control sub-circuit 831 is controlled by a control signal at the separate signal switching terminal SW. In other words, in some embodiments, when the signal provided by the signal switching terminal SW and the signal provided by the output enabling terminal OE are inverted from each other, the random shift circuit 830 may be configured to be capable of generating a gate driving signal having a row shift portion and randomly having a frame shift portion according to a second signal output by the sensing circuit 810 and a first signal output by the scanning circuit 820. More specifically, when the signal switching terminal SW in FIG. 8 outputs a signal which is inverted from that at the output enabling terminal OE, it is substantially equivalent to adding an inverter at the output enabling terminal OE shown in FIG. 4, so that the shift register 800 shown in FIG. 8 may implement the same functions as those of the shift register 400 shown in FIG. 4.

In some other embodiments, when the signal switching terminal SW outputs a constant high level signal, the random shift circuit 830 may be configured to be capable of generating a gate driving signal having a row shift portion and sequentially having the frame shift portion according to the second signal output by the sensing circuit 810 and the first signal output by the scanning circuit 820. More specifically, when the signal switching terminal SW in FIG. 8 always outputs a high level signal, cascaded output terminals (i.e., the first control output terminal CR1<n> and the second control output terminal CR2<n>) of the sensing circuit 810 and the scanning circuit 820 may always output signals normally. At this time, similarly to a conventional shift register, the shift register 800 may output a gate driving signal sequentially having the frame shift portion in cooperation with the random clock signals at the first random clock signal terminal CLKf1 and/or the second random clock signal terminal CLKf2 (for example, random pulses which occur sequentially, which may also be referred to as sequential pulses at this time). Therefore, the output signal at the signal switching terminal SW may be adjusted, so that the same shift register may support both a random frame shift and a sequential frame shift.

FIG. 9 is a circuit schematic diagram illustrating an exemplary shift register 900 according to yet another embodiment of the present disclosure. As shown in FIG. 9, the shift register 900 may comprise a sensing circuit 910, a scanning circuit 920, and a random shift circuit 930. As shown in FIG. 9, the random shift circuit 930 comprises first to eighth transistors T1 to T8.

In some embodiments, the sensing circuit 910 may comprise ninth to sixteenth transistors T9 to T16 and a first capacitor C1. In some embodiments, the ninth transistor T9 has a control terminal coupled to a cascaded output terminal (i.e., a first control output terminal CR1<n−1>) of a sensing circuit of a previous stage of shift register to receive an input signal, a first terminal coupled to a third voltage signal terminal VGH, and a second terminal coupled to a pull-up node Q1. An input sub-circuit of the sensing circuit 910 comprises the ninth transistor T9, and may be configured to transmit a third voltage signal (at, for example, a high level VGH) to the pull-up node Q1 under control of the input signal at CR1<n−1>.

In some embodiments, the tenth transistor T10 has a control terminal coupled to the pull-up node Q1, a first terminal coupled to a first random clock signal terminal CLKf1, and a second terminal coupled to an output terminal P1 of the sensing circuit 910. In addition, in some embodiments, the first capacitor C1 has a first terminal coupled to the pull-up node Q1, and a second terminal coupled to the output terminal P1 of the sensing circuit 910. The tenth transistor T10 and the first capacitor C1 may constitute an output sub-circuit of the sensing circuit 910, which may be configured to transmit a signal at the first random clock signal terminal CLKf1 to the output terminal of the sensing circuit 910 under control of the pull-up node Q1.

In some embodiments, the eleventh transistor T11 has a control terminal coupled to a cascaded output terminal (i.e., a first control signal terminal CR1<n+1>) of a sensing circuit of a next stage of shift register to receive a reset signal, a first terminal coupled to a first voltage signal terminal LVGL, and a second terminal coupled to the pull-up node Q1. A reset sub-circuit of the sensing circuit 910 comprises the eleventh transistor T11, and may be configured to transmit a first voltage signal (at, for example, a low level LVGL) to the pull-up node Q1 under control of the reset signal at CR1<n+1> to reset the sensing circuit 910.

In some embodiments, the twelfth transistor T12 has a control terminal coupled to a total reset line Total_Rs1, a first terminal coupled to the first voltage signal terminal LVGL, and a second terminal coupled to the pull-up node Q1. A total reset sub-circuit of the sensing circuit 910 comprises the twelfth transistor T12, and may be configured to transmit the first voltage signal (at, for example, a low level LVGL) to the pull-up node Q1 under control of a total rest signal at a total reset line Total_Rs1 to reset the sensing circuit 910.

In some embodiments, the thirteenth transistor T13 has a control terminal coupled to a pull-down node Qb1 of the sensing circuit 910, a first terminal coupled to the first voltage signal terminal LVGL, and a second terminal coupled to the output terminal P1 of the sensing circuit 910. An output pull-down sub-circuit of the sensing circuit 910 comprises the thirteenth transistor T13, and may be configured to transmit the first voltage signal (at, for example, a low level LVGL) to the output terminal P1 of the sensing circuit 910 under control of the pull-down node Qb1, so that the output terminal P1 outputs a low level signal.

In some embodiments, the fourteenth transistor T14 has a control terminal coupled to the pull-down node Qb1 of the sensing circuit 910, a first terminal coupled to the first voltage signal terminal LVGL, and a second terminal coupled to the pull-up node Q1. A pull-up node pull-down sub-circuit of the sensing circuit 910 comprises the fourteenth transistor T14, and may be configured to transmit the first voltage signal (at, for example, a low level LVGL) to the pull-up node Q1 under control of the pull-down node Qb1, so that the pull-up node Q1 remains at a low level when the pull-down node Qb1 becomes a high level.

In some embodiments, the fifteenth transistor T15 has a control terminal coupled to the pull-up node Q1, a first terminal coupled to the first voltage signal terminal LVGL, and a second terminal coupled to the pull-down node Qb1. The sixteenth transistor T16 has a control terminal and a first terminal coupled to the third voltage signal terminal VGH, and a second terminal coupled to the pull-down node Qb1. A pull-down node control sub-circuit of the sensing circuit 910 comprises the fifteenth transistor T15 and the sixteenth transistor T16, and may be configured to selectively transmit one of a third voltage signal (at, for example, a high level VGH) or the first voltage signal (at, for example, a low level LVGL) to the pull-down node Qb1 under control of the pull-up node Q1, so that the pull-down node Qb1 remains at a low level in a case where the pull-up node Q1 is at a high level, and the pull-down node Qb1 remains at a high level in a case where the pull-up node Q1 is at a low level.

Thus, the sensing circuit 910 is configured in the above manner, so that the sensing circuit 910 may implement a shift function.

In some embodiments, the scanning circuit 920 may comprise seventeenth to twenty-eighth transistors T17 to T28 and a second capacitor C2. In some embodiments, the seventeenth transistor T17 has a control terminal coupled to a cascaded output terminal (i.e., a second control output terminal CR2<n−1>) of a scanning circuit from the previous stage of shift register, a first terminal coupled to the third voltage signal terminal VGH, and a second terminal coupled to the pull-up node Q2. An input sub-circuit of the scanning circuit 920 comprises the seventeenth transistor T17, and may be configured to transmit the third voltage signal (at, for example, a high level VGH) to the pull-up node Q2 under control of an input signal at CR2<n−1>.

In some embodiments, the eighteenth transistor T18 has a control terminal coupled to the pull-up node Q2, a first terminal coupled to the first output clock signal terminal CLK1, and a second terminal coupled to an output terminal P2 of the scanning circuit 920. In addition, in some embodiments, the second capacitor C2 has a first terminal coupled to the pull-up node Q2, and a second terminal coupled to the output terminal P2 of the scanning circuit 920. An output sub-circuit of the scanning circuit 920 comprises the eighth transistor T18 and the second capacitor C2, and may be configured to transmit a signal at the first output clock signal terminal CLK1 to the output terminal P2 of the scanning circuit 920 under control of the pull-up node Q2.

In some embodiments, the nineteenth transistor T19 has a control terminal coupled to a cascaded output terminal (i.e., a second control output terminal CR2<n+1>) of a scanning circuit of the next stage of shift register, a first terminal coupled to the first voltage signal terminal LVGL, and a second terminal coupled to the pull-up node Q2. The twentieth transistor T20 has a control terminal also coupled to the cascaded output terminal (i.e., the second control output terminal CR2<n+1>) of the scanning circuit of the next stage of shift register, a first terminal coupled to a second voltage signal terminal VGL, and a second terminal coupled to an output terminal OUT of the shift register 900. A reset sub-circuit of the scanning circuit 920 comprises the nineteenth transistor T19 and the twentieth transistor T20, and may be configured to transmit the first voltage signal (at, for example, a low level LVGL) and the second voltage signal (at, for example, a low level VGL) to the pull-up node Q2 and the output terminal OUT of the shift register 900 respectively under control of a rest signal at CR2<n+1>, so that the scanning circuit 920 is reset and an overall output of the shift register 900 is at a low level.

In some embodiments, the twenty-first transistor T21 has a control terminal coupled to a total reset line Total_Rs2 (in some embodiments, Total_Rs2 and Total_Rs1 may be the same line or signal lines providing the same operating timing), a first terminal coupled to the first voltage signal terminal LVGL, and a second terminal coupled to the pull-up node Q2. The twenty-second transistor T22 has a control terminal also coupled to the total reset line Total_Rs2, a first terminal coupled to the second voltage signal terminal VGL, and a second terminal coupled to the output terminal OUT of the shift register 900. A total reset sub-circuit of the scanning circuit 920 comprises the twenty-first transistor T21 and the twenty-second transistor T22, and may be configured to transmit the first voltage signal (at, for example, a low level LVGL) and the second voltage signal (at, for example, a low level VGL) to the pull-up node Q2 and the output terminal OUT of the shift register 900 respectively under control of a total reset signal at a total reset line Total_Rs2, so that the scanning circuit 920 is reset and the overall output of the shift register 900 is at a low level.

In some embodiments, the twenty-third transistor T23 has a control terminal coupled to a pull-down node Qb2 of the scanning circuit 920, a first terminal coupled to the first voltage signal terminal LVGL, and a second terminal coupled to the output terminal P2 of the scanning circuit 920. An output pull-down sub-circuit of the scanning circuit 920 comprises the twenty-third transistor T23, and may be configured to transmit the first voltage signal (at, for example, a low level LVGL) to the output terminal P2 of the scanning circuit 920 under control of the pull-down node Qb2, so that the output terminal P2 outputs a low level signal.

In some embodiments, the twenty-fourth transistor T24 has a control terminal coupled to the pull-down node Qb2 of the scanning circuit 920, a first terminal coupled to the first voltage signal terminal LVGL, and a second terminal coupled to the pull-up node Q2. A pull-up node pull-down sub-circuit of the scanning circuit 920 comprises the twenty-fourth transistor T24, and may be configured to transmit the first voltage signal (at, for example, a low level LVGL) to the pull-up node Q2 under control of the pull-down node Qb2, so that the pull-up node Q2 remains at a low level in a case where the pull-down node Qb2 becomes a high level.

In some embodiments, the twenty-fifth transistor T25 has a control terminal and a first terminal coupled to the first output clock signal terminal CLK1, and a second terminal coupled to a control terminal of the twenty-sixth transistor T26. The twenty-sixth transistor T26 has a first terminal coupled to the first output clock signal terminal CLK1, and a second terminal coupled to the pull-down node Qb2. The twenty-seventh transistor T27 has a control terminal coupled to the output terminal P2 of the scanning circuit 920, a first terminal coupled to the second voltage signal terminal VGL, and a second terminal coupled to the control terminal of the twenty-sixth transistor T26. The twenty-eighth transistor T28 has a control terminal coupled to the output terminal P2 of the scanning circuit 920, a first terminal coupled to the first voltage signal terminal LVGL, and a second terminal coupled to the pull-down node Qb2. A pull-down node control sub-circuit of the scanning circuit 920 comprises the twenty-fifth transistor T25, the twenty-sixth transistor T26, the twenty-seventh transistor T27, and the twenty-eighth transistor T28, and may be configured to selectively transmit one of a high level clock signal at the first output clock signal terminal CLK1 or the first voltage signal (at, for example, a low level LVGL) to the pull-down node Qb2 under control of the pull-up node Q2, so that the pull-down node Qb2 remains at a low level in a case where the pull-up node Q2 is at a high level and the pull-down node Qb2 remains at a high level in a case where the pull-up node Q2 is at a low level.

Thus, the scanning circuit 920 is configured in the above manner, so that the scanning circuit 920 may implement a shift function.

The sensing circuit and the scanning circuit according to any of the embodiments described above with reference to FIGS. 4 to 7 may have the same structures as those of the sensing circuit 910 and the scanning circuit 920 described above respectively.

In the embodiment shown in FIG. 9, the transistors N2 and N3 may form an inverter, which may achieve the same function as that of the inverter shown in FIG. 4. The random shift circuit 930 of FIG. 9 is similar to the random shift circuit of FIG. 4 except that the third transistor T3 and the fourth transistor T4 shown in FIG. 4 are omitted. That is, in the embodiment shown in FIG. 9, when the output enabling terminal OE is at a low level, the transistor N3 is turned off, so that a high level signal at the third voltage signal terminal VGH is transmitted to the control terminal of the first transistor T1 through the transistor N2 which is turned on, and thereby the sensing circuit 910 normally outputs a cascaded output (i.e., the first control output terminal CR1<n> normally provides an output) during the scanning period shown in FIG. 6. When the output enabling terminal OE is at a high level, the fourth transistor T4 is turned on, so that a low level signal at the first voltage signal terminal LVGL is transmitted to the control terminal of the first transistor T1 through the fourth transistor T4 which is turned on, and thereby the sensing circuit 910 does not output a cascaded output (i.e., the first control output terminal CR1<n> is always at a low level) during the blanking period shown in FIG. 6. The same is true for the second transistor T2. Therefore, in the embodiment shown in FIG. 9, the cascaded output control sub-circuit may comprise the first transistor T1, the second transistor T2, and the inverter formed by the transistors N2 and N3, and realizes functions similar to those of the cascaded output control sub-circuit 431 shown in FIG. 4. In addition, the output sub-circuit of the random shift circuit 930 shown in FIG. 9 has the same construction as that of the output sub-circuit 435 of the random shift circuit 430 shown in FIG. 4, and details thereof will not be described here.

The embodiment in FIG. 9 differs from the embodiment shown in FIG. 4 in that the frame shift sub-circuit of the random shift circuit 930 shown in FIG. 9 comprises the fifth transistor T5 and the sixth transistor T6. Unlike FIG. 4 in which the control terminal of the fifth transistor T5 is controlled by both the third transistor T3 and the fourth transistor T4, the control terminal of the fifth transistor T5 is controlled by the output terminal P1 of the sensing circuit 910 in FIG. 9. However, it may be seen in conjunction with the timing diagram shown in FIG. 6 that the combination of the fifth transistor T5 with the sixth transistor T6 in FIG. 9 can achieve the same or similar function to that achieved by the combination of the second, third, and fourth transistors T2, T3, T4 with the sixth transistor T6 in FIG. 4, and details thereof will not be described here.

Therefore, both the shift register 900 shown in FIG. 9 and the shift register 400 shown in FIG. 4 may provide a "random frame shift" function.

Figure 10:
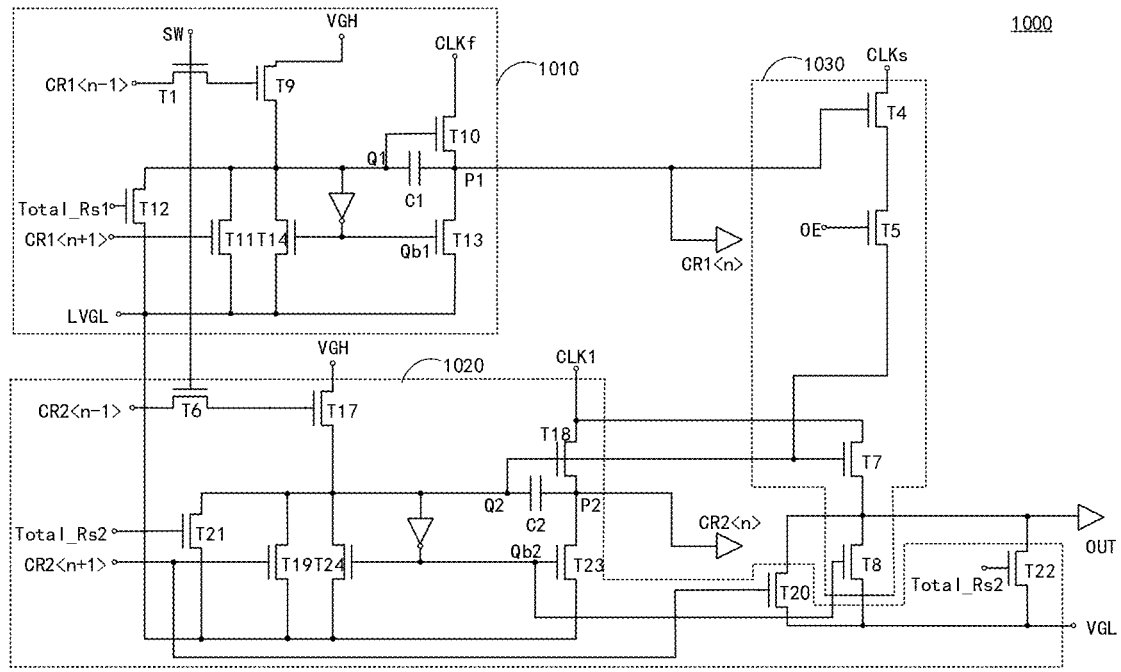
FIG. 10 is a circuit schematic diagram illustrating an exemplary shift register according to still another embodiment of the present disclosure.

FIG. 10 is a circuit schematic diagram illustrating an exemplary shift register 1000 according to still another embodiment of the present disclosure. As shown in FIG. 10, the shift register 1000 may comprise a sensing circuit 1010, a scanning circuit 1020, and a random shift circuit 1030. The random shift circuit 1030 comprises, for example, a fifth transistor T5, a sixth transistor T6, a seventh transistor T7, and an eighth transistor T8. In addition, unless explicitly stated otherwise, in the shift register 1000 shown in FIG. 10, transistors and capacitors having the same reference signs as those in FIG. 9 may generally have functions and/or connection relationships which are the same as or similar to those of the transistors and the capacitors shown in FIG. 9, and details thereof will not be described here.

Compared with the shift register 900 shown in FIG. 9, in the shift register 1000 shown in FIG. 10, two transistors, i.e., the first transistor T1 and the second transistor T2, which are used to control cascaded output terminals (that is, the first control output terminal CR1<n> and the second control output terminal CR2<n>) of the sensing circuit 1010 and the scanning circuit 1020, are moved into the sensing circuit 1010 and the scanning circuit 1020 respectively to receive input signals. In other words, the control of the cascaded output terminals (i.e., the first control output terminal CR1<n> and the second control output terminal CR2<n>) are transferred from the control output terminal of the shift register to the input terminal of the shift register, that is, to an output control terminal of a previous stage of shift register. Therefore, in a case of the operating sequence shown in FIG. 6, for example, in consideration of the principle of using the signal switching terminal SW in FIG. 7 and FIG. 8, it may be seen that the shift register 1000 shown in FIG. 10 may realize functions which are the same as or similar to as those of the shift register 900 shown in FIG. 9.

In addition, pull-down control sub-circuits in the sensing circuit 1010 and the scanning circuit 1020 in FIG. 10 are implemented as inverters respectively. In a case of the timing diagram shown in FIG. 6, the pull-down node control sub-circuits may actually implement functions which are the same as or similar to those of the pull-down node control sub-circuits in the sensing circuit 910 and the scanning circuit 920 in FIG. 9, and detailed structures thereof will not be described here.

In addition, in some embodiments, a period at the output enabling terminal OE may correspond to a frame frequency, that is, a time length of one period thereof may be the same as a time length of one frame. In addition, this period may also be used at the frame shift clock signal terminal CLKs, and an output signal at the frame shift clock signal terminal CLKs may be used as both a charging signal at the pull-up node Q2 and a discharging signal at the pull-up node Q2.

In addition, some embodiments of the present disclosure provide a gate driving circuit (for example, the gate driving circuit 500, etc.), which comprises a plurality of cascaded shift registers described above (for example, the shift registers 300, 400, 700, 800, 900 and 1000, etc.)

In addition, some embodiments of the present disclosure provide a display apparatus. The display apparatus may comprise the gate driving circuit (for example, the gate driving circuit 500, etc.) described above.

With the shift register, the method for driving the same, the gate driving circuit, and the display apparatus according to the embodiments of the present disclosure, a required composite pulse may be generated when an external compensation scheme is adopted, which realizes correct driving of the pixel circuit, so that the OLED display apparatus may emits light more evenly and better user experience is achieved.

The present disclosure has been described so far in connection with the preferred embodiments. It should be understood that those skilled in the art may make various other changes, substitutions, and additions without departing from the spirit and scope of the present disclosure. Therefore, the scope of the present disclosure is not limited to the specific embodiments described above, but should be defined by the appended claims.

In addition, the functions described herein as being implemented by pure hardware, pure software, and/or firmware may also be implemented by means of dedicated hardware, a combination of general-purpose hardware and software etc. For example, the functions described as being implemented by dedicated hardware (for example, a Field Programmable Gate Array (FPGA), an Application Specific Integrated Circuit (ASIC), etc.) may be implemented by a combination of general-purpose hardware (for example, a Central Processing Unit (CPU) and a Digital Signal Processor (DSP)) and software, and vice versa.

We claim:

1. A shift register, comprising:
    a scanning circuit configured to generate a first signal for causing a gate driving signal output by the shift register to have a row shift portion during a scanning period;
    a sensing circuit configured to generate a second signal for causing the gate driving signal to have a frame shift portion during a blanking period; and
    a random shift circuit electrically coupled to the scanning circuit and the sensing circuit respectively, and configured to generate the gate driving signal having the row shift portion and randomly having the frame shift portion based on the first signal and the second signal.

2. The shift register according to claim 1, wherein
    the first signal comprises at least one of a signal at a pull-up node of the scanning circuit, a signal at a pull-down node of the scanning circuit, or a signal at an output terminal of the scanning circuit; and
    the second signal comprises at least one of a signal at a pull-up node of the sensing circuit, a signal at a pull-down node of the sensing circuit, or a signal at an output terminal of the sensing circuit.

3. The shift register according to claim 2, wherein
    the sensing circuit is coupled to a random clock signal terminal, and is configured to cause the signal at the pull-up node of the sensing circuit to remain valid during the scanning period and the blanking period in response to occurrence of a random change in a signal waveform at the random clock signal terminal during the scanning period; and the random shift circuit is coupled to the pull-up node or the output terminal of the sensing circuit, to the pull-up node of the scanning circuit, and to a frame shift clock signal terminal, and the random shift circuit is configured to cause a voltage at the frame shift clock signal terminal to be stored at the pull-up node of the scanning circuit under control of the signal at the pull-up node or the output terminal of the sensing circuit during the blanking period, and generate the gate driving signal having the frame shift portion based on the stored voltage.

4. The shift register according to claim 2, wherein the random shift circuit comprises:

a cascaded output control sub-circuit coupled to an output enabling terminal, a first control output terminal, a second control output terminal, the output terminal of the sensing circuit and the output terminal of the scanning circuit, and configured to provide the signal at the output terminal of the sensing circuit to the first control output terminal and provide the signal at the output terminal of the scanning circuit to the second control output terminal, under control of the output enabling terminal;

a frame shift sub-circuit coupled to the output enabling terminal, the pull-up node and the pull-down node of the sensing circuit, a frame shift clock signal terminal, a random clock signal terminal, a first reference signal terminal, and the pull-up node of the scanning circuit, and configured to transmit a frame shift clock signal at the frame shift clock signal terminal to the pull-up node of the scanning circuit under control of the output enabling terminal, the pull-up node of the sensing circuit, the pull-down node of the sensing circuit, the random clock signal terminal, and the first reference signal terminal; and an output sub-circuit coupled to an output clock signal terminal, the pull-up node and the pull-down node of the scanning circuit, a second reference signal terminal and an output terminal of the shift register, and configured to selectively transmit one of an output clock signal at the output clock signal terminal and a second reference signal at the second reference signal terminal to the output terminal of the shift register as the gate driving signal output by the shift register, under control of the pull-up node of the scanning circuit and the pull-down node of the scanning circuit.

5. The shift register according to claim 3, wherein the random clock signal terminal is configured to randomly remain at a continuous potential under control of a random signal.

6. The shift register according to claim 2, wherein the random shift circuit comprises:

a cascaded output control sub-circuit coupled to a signal switching terminal, a first control output terminal, a second control output terminal, the output terminal of the sensing circuit and the output terminal of the scanning circuit, and configured to provide the signal at the output terminal of the sensing circuit to the first control output terminal and provide the signal at the output terminal of the scanning circuit to the second control output terminal, under control of the signal switching terminal;

a frame shift sub-circuit coupled to an output enabling terminal, the pull-up node and the pull-down node of the sensing circuit, a frame shift clock signal terminal, a random clock signal terminal, a first reference signal terminal, and the pull-up node of the scanning circuit, and configured to transmit a frame shift clock signal at the frame shift clock signal terminal to the pull-up node of the scanning circuit under control of the output enabling terminal, the pull-up node of the sensing circuit, the pull-down node of the sensing circuit, the random clock signal terminal, and the first reference signal terminal; and an output sub-circuit coupled to an output clock signal terminal, the pull-up node and the pull-down node of the scanning circuit, a second reference signal terminal and an output terminal of the shift register, and configured to selectively transmit one of an output clock signal at the output clock signal terminal and a second reference signal at the second reference signal terminal to the output terminal of the shift register as the gate driving signal output by the shift register, under control of the pull-up node of the scanning circuit and the pull-down node of the scanning circuit.

7. The shift register according to claim 6, wherein the cascaded output control sub-circuit comprises a first transistor and a second transistor, wherein the first transistor has a control terminal coupled to the signal switching terminal, a first terminal coupled to the output terminal of the sensing circuit, and a second terminal coupled to the first control output terminal; and the second transistor has a control terminal coupled to the signal switching terminal, a first terminal coupled to the output terminal of the scanning circuit, and a second terminal coupled to the second control output terminal.

8. The shift register according to claim 2, wherein the random shift circuit comprises a cascaded output control sub-circuit, a frame shift sub-circuit and an output sub-circuit, and the frame shift sub-circuit comprises a third transistor, a fourth transistor, a fifth transistor, and a sixth transistor, wherein the third transistor has a control terminal coupled to the pull-up node of the sensing circuit, a first terminal coupled to a random clock signal terminal, and a second terminal coupled to a control terminal of the fifth transistor;

the fourth transistor has a control terminal coupled to the pull-down node of the sensing circuit, a first terminal coupled to a first reference signal terminal, and a second terminal coupled to the control terminal of the fifth transistor;

the fifth transistor has a first terminal coupled to a frame shift clock signal terminal, and a second terminal coupled to a first terminal of the sixth transistor; and the sixth transistor has a control terminal coupled to an output enabling terminal, and a second terminal coupled to the pull-up node of the scanning circuit.

9. The shift register according to claim 2, wherein the random shift circuit comprises:

a cascaded output control sub-circuit coupled to an output enabling terminal, a first control output terminal, a second control output terminal, the output terminal of the sensing circuit and the output terminal of the scanning circuit, and configured to provide the signal at the output terminal of the sensing circuit to the first control output terminal and provide the signal at the output terminal of the scanning circuit to the second control output terminal under control of the output enabling terminal;

a frame shift sub-circuit coupled to the output enabling terminal, the output terminal of the sensing circuit, a frame shift clock signal terminal, and the pull-up node of the scanning circuit, and configured to transmit a frame shift clock signal at the frame shift clock signal terminal to the pull-up node of the scanning circuit under control of the output enabling terminal, and the output terminal of the sensing circuit; and an output sub-circuit coupled to an output clock signal terminal, the pull-up node and the pull-down node of the scanning circuit, a second reference signal terminal and an output terminal of the shift register, and configured to selectively transmit one of an output clock signal at the output clock signal terminal and a second reference signal at the second reference signal terminal to the output terminal of the shift register as the gate driving signal output by the shift register, under control of the pull-up node and the pull-down node of the scanning circuit.

10. The shift register according to claim 2, wherein the scanning circuit and the sensing circuit are further configured to selectively receive input signals under control of the signal switching terminal, the output terminal of the sensing circuit is used as a first control output terminal, and the output terminal of the scanning circuit is used as a second control output terminal.

11. The shift register according to claim 10, wherein the random shift circuit comprises:

a frame shift sub-circuit coupled to an output enabling terminal, the output terminal of the sensing circuit, a frame shift clock signal terminal and the pull-up node of the scanning circuit, and configured to transmit a frame shift clock signal at the frame shift clock signal terminal to the pull-up node of the scanning circuit under control of the output enabling terminal and the output terminal of the sensing circuit; and an output sub-circuit coupled to an output clock signal terminal, the pull-up node and the pull-down node of the scanning circuit, a second reference signal terminal and an output terminal of the shift register, and configured to selectively transmit one of an output clock signal at the output clock signal terminal and a second reference signal at the second reference signal terminal to the output terminal of the shift register as an output signal of the shift register under control of the pull-up node and the pull-down node of the scanning circuit.

12. The shift register according to claim 9, wherein the frame shift sub-circuit comprises a fifth transistor and a sixth transistor, wherein the fifth transistor has a control terminal coupled to the output terminal of the sensing circuit, a first terminal coupled to the frame shift clock signal terminal, and a second terminal coupled to a first terminal of the sixth transistor; and the sixth transistor has a control terminal coupled to the output enabling terminal, and a second terminal coupled to the pull-up node of the scanning circuit.

13. The shift register according to claim 2, wherein the random shift circuit comprises a cascaded output control sub-circuit, a frame shift sub-circuit and an output sub-circuit, and the cascaded output control sub-circuit comprises an inverter, a first transistor, and a second transistor, wherein the inverter has a first terminal coupled to an output enabling terminal, and a second terminal coupled to a control terminal of the first transistor and a control terminal of the second transistor;

the first transistor has a first terminal coupled to the output terminal of the sensing circuit, and a second terminal coupled to a first control output terminal; and the second transistor has a first terminal coupled to the output terminal of the scanning circuit, and a second terminal coupled to a second control output terminal.

14. The shift register according to claim 2, wherein the random shift circuit comprises a cascaded output control sub-circuit, a frame shift sub-circuit and an output sub-circuit, and the output sub-circuit comprises a seventh transistor and an eighth transistor, wherein the seventh transistor has a control terminal coupled to the pull-up node of the scanning circuit, a first terminal coupled to the output clock signal terminal, and a second terminal coupled to the output terminal of the shift register; and the eight transistor has a control terminal coupled to the pull-down node of the scanning circuit, a first terminal coupled to the second reference signal terminal, and a second terminal coupled to the output terminal of the shift register.

15. A gate driving circuit, comprising a plurality of cascaded shift registers according to claim 1.

16. A display apparatus, comprising the gate driving circuit according to claim 15.

17. A method for driving the shift register according to claim 1, comprising:

generating, by the scanning circuit, a first signal for causing a gate driving signal to have a row shift portion during a scanning period, under control of an output clock signal at an output clock signal terminal;

generating, by the sensing circuit, a second signal for causing the gate driving signal to have a frame shift portion during a blanking period, under control of a random clock signal at a random clock signal terminal; and generating, by the random shift circuit, the gate driving signal having the row shift portion and randomly having the frame shift portion based on the first signal and the second signal under control of a frame shift clock signal at a frame shift clock signal terminal, the output clock signal at the output clock signal terminal, and an output enabling signal at an output enabling terminal.

18. The method according to claim 17, wherein the shift register further comprises a signal switching terminal coupled to the random shift circuit or to the scanning circuit and the sensing circuit, and when a signal at the signal switching terminal and the signal at the output enabling terminal are inverted from each other, the random shift circuit generates the gate driving signal having the row shift portion and randomly having the frame shift portion according to the first signal and the second signal.

19. The method according to claim 17, wherein the shift register further comprises a signal switching terminal coupled to the random shift circuit or to the scanning circuit and the sensing circuit, and when a signal at the signal switching terminal is a constant high level signal, the random shift circuit generates the gate driving signal having the row shift portion and sequentially having the frame shift portion according to the first signal and the second signal.

20. The method according to claim 11, wherein the frame shift sub-circuit comprises a fifth transistor and a sixth transistor, wherein the fifth transistor has a control terminal coupled to the output terminal of the sensing circuit, a first terminal coupled to the frame shift clock signal terminal, and a second terminal coupled to a first terminal of the sixth transistor; and the sixth transistor has a control terminal coupled to the output enabling terminal, and a second terminal coupled to the pull-up node of the scanning circuit.

* * * * *